US012805070B2

(12) United States Patent
Yoshida et al.

(10) Patent No.: US 12,805,070 B2
(45) Date of Patent: Nov. 17, 2026

(54) NITRIDE SEMICONDUCTOR LIGHT-EMITTING ELEMENT

(71) Applicant: Nuvoton Technology Corporation Japan, Kyoto (JP)

(72) Inventors: Shinji Yoshida, Shiga (JP); Hideo Kitagawa, Toyama (JP); Takahiro Okaguchi, Toyama (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 369 days.

(21) Appl. No.: 18/392,668

(22) Filed: Dec. 21, 2023

(65) Prior Publication Data

US 2024/0128406 A1 Apr. 18, 2024

Related U.S. Application Data

(63) Continuation of application No. PCT/JP2022/024936, filed on Jun. 22, 2022.

(30) Foreign Application Priority Data

Jun. 29, 2021 (JP) ................................ 2021-108187

(51) Int. Cl.

*H10H 20/825* (2025.01)
*H10H 20/817* (2025.01)
*H10H 20/84* (2025.01)

(52) U.S. Cl.

CPC ........ *H10H 20/825* (2025.01); *H10H 20/817* (2025.01); *H10H 20/84* (2025.01)

(58) Field of Classification Search

CPC .... H10H 20/825; H10H 20/817; H10H 20/84; H01S 5/141; H01S 5/02212;

(Continued)

(56) References Cited

U.S. PATENT DOCUMENTS 7,843,980 B2 * 11/2010 Ohta .................. H01S 5/32025 372/50.1
2003/0123506 A1 * 7/2003 Yamanaka ............. H01S 5/028 372/49.01

(Continued)

FOREIGN PATENT DOCUMENTS

JP 2008078465 A * 4/2008
JP 2011-119540 A 6/2011

(Continued)

OTHER PUBLICATIONS

International Search Report dated Aug. 2, 2022 issued in International Patent Application No. PCT/JP2022/024936, with English translation.

*Primary Examiner* — Bitew A Dinke
(74) *Attorney, Agent, or Firm* — Rimon P.C.

(57) ABSTRACT

A nitride semiconductor light-emitting element includes: a nitride semiconductor that has two resonator faces opposed to each other; and a dielectric multilayer film that is layered on at least one resonator face of the two resonator faces. For example, the dielectric multilayer film layered on a resonator face includes a first dielectric film layered on the resonator face and a second dielectric film layered on the first dielectric film. The first dielectric film includes aluminum oxynitride. The second dielectric film includes aluminum oxide. The first dielectric film is a crystalline film. At least one of chemical elements of yttrium or lanthanum is added to the first dielectric film. At least one of chemical elements of yttrium or lanthanum is added to the second dielectric film.

19 Claims, 18 Drawing Sheets

(58) Field of Classification Search
CPC ............... H01S 5/04252; H01S 5/0287; H01S 5/04254; H01S 5/143; H01S 5/2009; H01S 5/3063; H01S 5/3211; H01S 5/34333; H01S 2301/176; H01S 5/2202
See application file for complete search history.

(56) References Cited

U.S. PATENT DOCUMENTS

| | | | | | |
|---|---|---|---|---|---|
| 2003/0210722 | A1* | 11/2003 | Arakida | H01S 5/028 | 372/49.01 |
| 2004/0062507 | A1* | 4/2004 | Shigihara | H01S 5/0287 | 385/131 |
| 2004/0190576 | A1* | 9/2004 | Matsuoka | H01S 5/028 | 372/43.01 |
| 2004/0213314 | A1* | 10/2004 | Kunitsugu | H01S 5/028 | 372/49.01 |
| 2004/0233959 | A1* | 11/2004 | Arakida | H01S 5/4031 | 372/49.01 |
| 2007/0138492 | A1* | 6/2007 | Kamikawa | H01S 5/34333 | 257/94 |
| 2008/0181274 | A1* | 7/2008 | Michiue | H01S 5/028 | 372/44.011 |
| 2009/0003404 | A1* | 1/2009 | Ishikawa | H01S 5/028 | 372/99 |
| 2009/0200573 | A1* | 8/2009 | Kawakami | B82Y 20/00 | 438/46 |
| 2009/0257466 | A1* | 10/2009 | Eberhard | H01S 5/0281 | 372/45.01 |
| 2010/0314653 | A1* | 12/2010 | Orita | B82Y 20/00 | 257/E33.023 |
| 2010/0316082 | A1* | 12/2010 | Kawaguchi | H01S 5/34333 | 372/49.01 |
| 2011/0051767 | A1* | 3/2011 | Kelemen | H01S 5/0021 | 438/22 |
| 2014/0346557 | A1* | 11/2014 | Yoshida | H01S 5/34333 | 257/103 |
| 2015/0124847 | A1* | 5/2015 | Yoshida | B82Y 20/00 | 372/49.01 |
| 2016/0365699 | A1* | 12/2016 | Lell | H01S 5/0282 | |
| 2017/0310077 | A1* | 10/2017 | Zhang | H01J 37/32899 | |
| 2020/0203921 | A1* | 6/2020 | Fuchs | H01S 5/4031 | |
| 2020/0373730 | A1* | 11/2020 | Kitagawa | H01S 5/0014 | |

FOREIGN PATENT DOCUMENTS

| | | | |
|---|---|---|---|
| JP | 4799339 | B2 | 10/2011 |
| JP | 5042609 | B2 | 10/2012 |
| WO | 2009/147853 | A1 | 12/2009 |
| WO | 2014/002339 | A1 | 1/2014 |
| WO | 2014/097508 | A1 | 6/2014 |
| WO | 2019/159449 | A1 | 8/2019 |

* cited by examiner

FIG. 4

| Layer | Material | In composition or Al composition (%) | Film thickness (nm) | Impurity concentration ($cm^{-3}$) |
|---|---|---|---|---|
| Pad electrode | Cr (Ti) / Pt / Au | - | 1500 | - |
| P-side electrode | Pt | - | 35 | - |
| | Pd | - | 40 | - |
| Current block layer | $SiO_2$ | - | 300 | - |
| Contact layer | GaN | - | 10 | 2E20 |
| | GaN | - | 50 | 2E19 |
| P cladding layer | AlGaN | 2.6 | 480 | 1E19 |
| | AlGaN | 2.6 | 180 | 2E18 |
| Electron barrier layer | AlGaN | 36 | 1 | 1.5E19 |
| | AlGaN | 4→36 | 5 | 1.5E19 |
| Intermediate layer | GaN | - | 6 | - |
| | InGaN | 0.3→0 | 21 | - |
| P-side guiding layer | InGaN | 0.3 | 39 | - |
| Active layer | InGaN | 0.8 | 18 | - |
| | InGaN | 6.6 | 7.5 | - |
| N-side guiding layer | InGaN | 0.8 | 190 | - |
| N guiding layer | GaN | - | 127 | 1E18 |
| N cladding layer | AlGaN | 2.6 | 3000 | 1E18 |
| Base | GaN | - | 85000 | 1.4E18 |
| N-side electrode | Ti | - | 10 | - |
| | Pt | - | 35 | - |
| | Au | - | 300 | - |

| | 1st layer | 2nd layer | 3rd layer | 4th layer | 5th layer |
|---|---|---|---|---|---|
| Material | YAlON | $YAl_2O_3$ | YAlON | $YAl_2O_3$ | $SiO_2$ |
| Film thickness (nm) | 21 | 13 | 11 | 160 | 57 |

| | 1st layer | 2nd layer | 3rd layer | 4th layer | 5th layer | ··· | 19th layer |
|---|---|---|---|---|---|---|---|
| Material | YAlON | $YAl_2O_3$ | YAlON | $SiO_2$ | YAlON | ··· | YAlON |
| Film thickness (nm) | 21 | 125 | 11 | 68 | 51 | ··· | 51 |

NITRIDE SEMICONDUCTOR LIGHT-EMITTING ELEMENT

CROSS REFERENCE TO RELATED APPLICATIONS

This is a continuation application of PCT International Application No. PCT/JP2022/024936 filed on Jun. 22, 2022, designating the United States of America, which is based on and claims priority of Japanese Patent Application No. 2021-108187 filed on Jun. 29, 2021. The entire disclosures of the above-identified applications, including the specifications, drawings and claims are incorporated herein by reference in their entirety.

FIELD

The present disclosure relates to a nitride semiconductor light-emitting element.

BACKGROUND

Conventionally, a nitride semiconductor that emits light such as laser light has end faces (resonator faces) on which films are formed for causing light to resonate inside or outside the nitride semiconductor for appropriately emitting light from a nitride semiconductor light-emitting element (for example, see Patent Literature (PTL) 1 through PTL 4).

CITATION LIST

Patent Literature

[PTL 1] Japanese Patent No. 4799339

[PTL 2] Japanese Patent No. 5042609

[PTL 3] Japanese Unexamined Patent Application Publication No. 2011-119540

[PTL 4] International Publication No. 2009/147853

SUMMARY

Technical Problem

Improvement in reliability of a nitride semiconductor light-emitting element that includes a nitride semiconductor and films on the end faces of the nitride semiconductor has been desired.

The present disclosure provides a nitride semiconductor light-emitting element with improved reliability.

Solution to Problem

A nitride semiconductor light-emitting element according to one aspect of the present disclosure includes a nitride semiconductor that has two resonator faces opposed to each other; and a dielectric multilayer film that includes a first dielectric film layered on at least one resonator face of the two resonator faces, and a second dielectric film layered on the first dielectric film. The first dielectric film includes aluminum oxynitride. The second dielectric film includes aluminum oxide. The first dielectric film is a crystalline film. At least one of chemical elements of yttrium or lanthanum is added to the first dielectric film. At least one of chemical elements of yttrium or lanthanum is added to the second dielectric film.

Advantageous Effects

According to the present disclosure, a nitride semiconductor light-emitting element with improved reliability can be provided.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 4 is a table showing the configuration of the nitride semiconductor according to the embodiment.

DESCRIPTION OF EMBODIMENTS (Underlying Knowledge Forming Basis of the Present Disclosure)

In recent years, there has been a growing need for high-power nitride semiconductor light-emitting elements in fields of laser light machining, laser direct imaging (LDI), etc. From viewpoints of material diversification in laser machining and miniaturization, generalization, and the like in LDI in recent years, these nitride semiconductor light-emitting elements have also been required to emit light (e.g., laser light) having a shorter wavelength. Moreover, a wavelength multiplexing technique for multiplexing several beams of laser light having different wavelengths is used for achieving high-power light. Although an external resonator technique for outputting laser light having a specific wavelength and a wavelength multiplexing technique are used, high-quality light (e.g., light having stability in optical properties, such as an optical output and a spot shape) is still required. For this reason, wavelengths of light to be output (emitted) by the nitride semiconductor light-emitting elements are required to be stable, from viewpoints of readily controlling and multiplexing the wavelengths.

According to the above requirements, films (dielectric films) to be provided on the end faces of a nitride semiconductor are required to have optical properties, such as a transmittance, a reflectance, and a refractive index, which do not readily change due to light. For example, such films are required to be resistant to high-power light, to be resistant to light in the ultraviolet range, and to maintain a low reflectance at the light-emitting-side end face.

Figure 25:
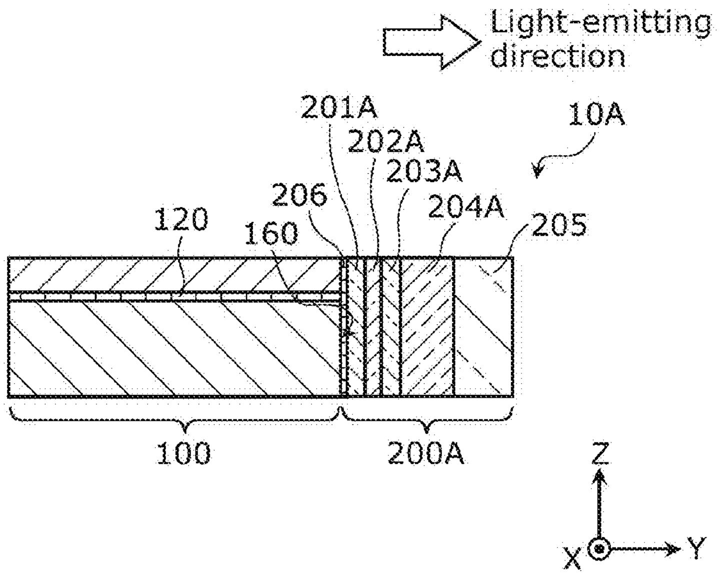
FIG. 25 is a cross sectional view schematically illustrating a configuration of the nitride semiconductor light-emitting element according to comparative example 3.

FIG. 25 is a cross sectional view schematically illustrating a configuration of nitride semiconductor light-emitting element 10A according to comparative example 3.

Nitride semiconductor light-emitting element 10A includes, for example, nitride semiconductor 100 and dielectric multilayer film 200A provided on the light-emitting end face of nitride semiconductor 100.

Dielectric multilayer film 200A includes, in the following stated order from the side on which resonator face 160 that is the light-emitting end face of nitride semiconductor 100 is present, dielectric film 206 including SiN or SiON, dielectric film 201A including AlON, dielectric film 202A including $Al_2O_3$, dielectric film 203A including AlON, dielectric film 204A including $Al_2O_3$, and dielectric film 205 including $SiO_2$. Dielectric film 206, dielectric film 201A, dielectric film 202A, dielectric 203A, dielectric film 204A, and dielectric film 205 have film thicknesses of 3 nm, 20 nm, 13 nm, 11 nm, 160 nm, and 57 nm, respectively. In addition, dielectric films 202A, 204A, and 205 each are amorphous (at the time of film formation by deposition), and dielectric films 201A and 203A each are a dielectric film including at least a crystalline region.

Figure 26:
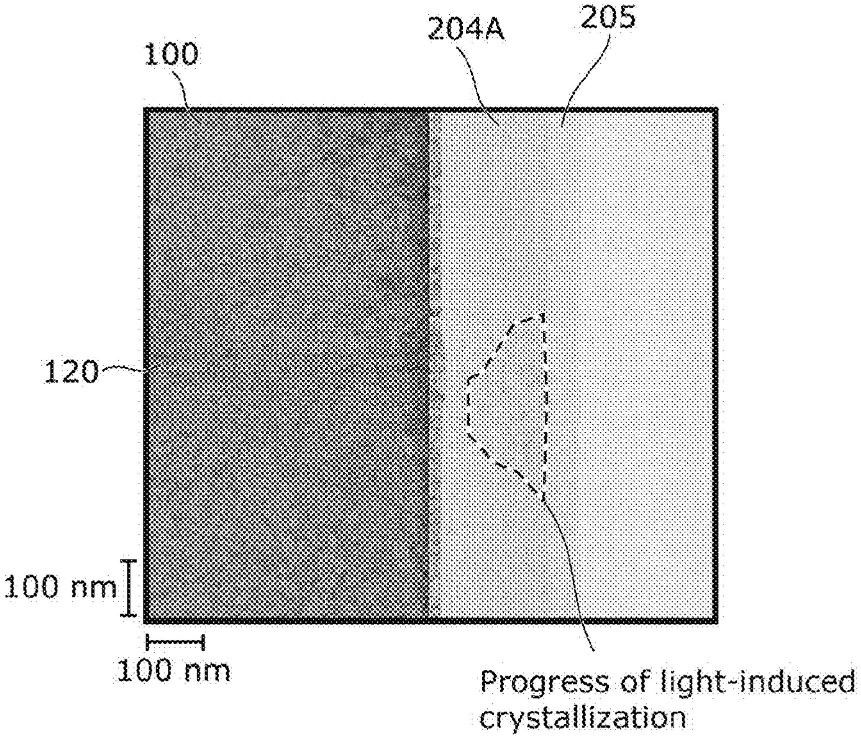
FIG. 26 is a diagram illustrating a TEM image of the nitride semiconductor light-emitting element according to comparative example 3.

FIG. 26 is a diagram illustrating one example of a TEM image of nitride semiconductor light-emitting element 10A according to comparative example 3. FIG. 26 is the TEM image captured after driving nitride semiconductor light-emitting element 10A that emits, for example, light whose peak wavelength is 405 nm in a continuous wave (CW) at 1.4 W (at 25° C.) for 300 hours. Moreover, nitride semiconductor 100 has a ridge having a width of 7 μm in this example.

As illustrated in FIG. 26, a portion of dielectric film 204A that was amorphous is crystallized.

Figure 27:
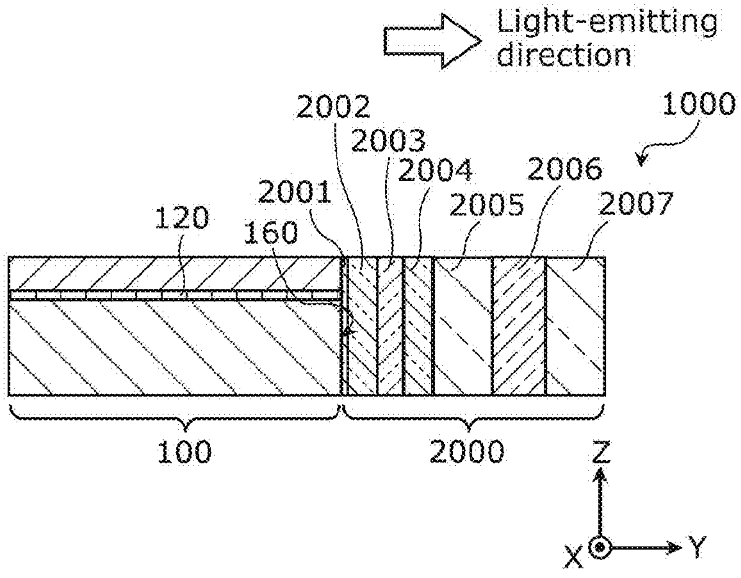
FIG. 27 is a cross sectional view schematically illustrating a configuration of a nitride semiconductor light-emitting element according to comparative example 4.

FIG. 27 is a cross sectional view schematically illustrating a configuration of nitride semiconductor light-emitting element 1000 according to comparative example 4.

Nitride semiconductor light-emitting element 1000 includes, for example, nitride semiconductor 100 including light-emitting layer 120 from which light is emitted, and dielectric multilayer film 2000 provided on resonator face 160 of nitride semiconductor 100.

Dielectric multilayer film 2000 includes, in the following stated order from the resonator face 160 side of nitride semiconductor 100, dielectric film 2001 including AlON, dielectric film 2002 including AlN, dielectric film 2003 including $Al_2O_3$, dielectric film 2004 including AlN, dielectric film 2005 including $SiO_2$, dielectric film 2006 including $Al_2O_3$, and dielectric film 2007 including $SiO_2$. Dielectric film 2001, dielectric film 2002, dielectric film 2003, and dielectric film 2004 have film thicknesses of 3 nm, 18 nm, 13 nm, and 11 nm, respectively. In addition, dielectric films 2003 and 2005 through 2007 each are amorphous (at the time of film formation by deposition), and dielectric films 2001, 2002, and 2004 each are a dielectric film including at least a crystalline region.

Figure 28:
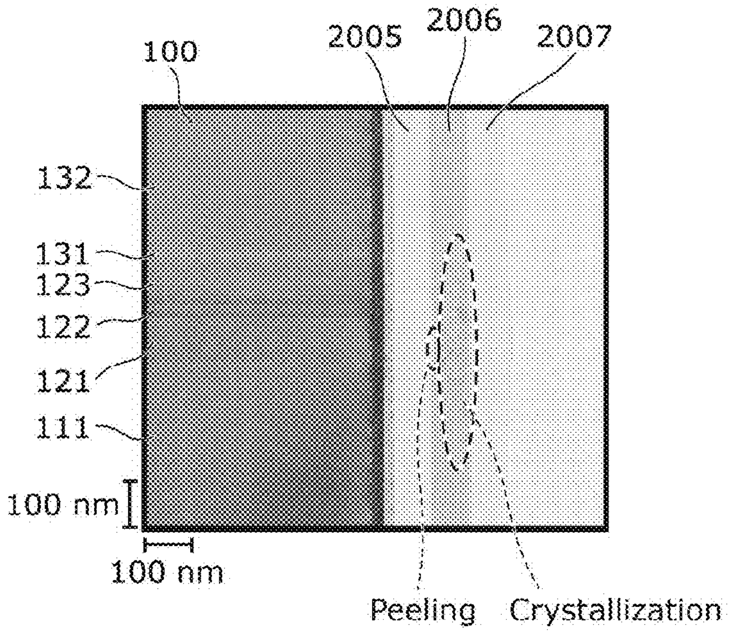
FIG. 28 is a diagram illustrating a TEM image of the nitride semiconductor light-emitting element according to comparative example 4.

FIG. 28 is a diagram illustrating a TEM image of nitride semiconductor light-emitting element 1000 according to comparative example 4. FIG. 28 is the TEM image captured after driving nitride semiconductor light-emitting element 1000 that emits, for example, light whose peak wavelength is 405 nm with a pulse width of 200 ns (a pulse duty ratio of 50%) at 1.2 W (at 50° C.) for 8500 hours.

As illustrated in FIG. 28, a portion of dielectric film 2006 that was amorphous is crystallized, and peeling (gap) that was not present is occurred between dielectric film 2005 and dielectric film 2006.

As described above, when dielectric multilayer film 2000 provided on resonator face 160 of nitride semiconductor 100 is amorphous, the volume of a dielectric film changes due to a reaction between dielectric films and crystallization. Accordingly, peeling (film peeling) may occur between dielectric films or between a nitride semiconductor and a dielectric film.

Figure 29:
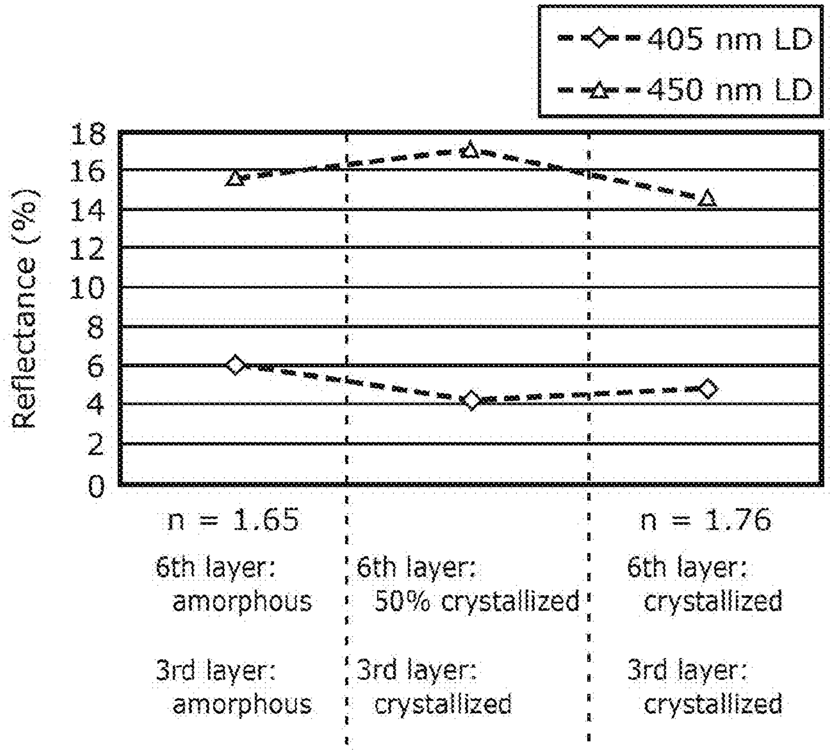
FIG. 29 is a diagram illustrating reflectances of a dielectric multilayer film for respective states of dielectric films.

FIG. 29 is a diagram illustrating reflectances of dielectric multilayer film 2000 for respective states of dielectric films 2003 and 2006. Note that the "3rd layer" indicated in FIG.

29 is the third one of dielectric films included in dielectric multilayer film 2000, counting from the resonator 160 side of nitride semiconductor 100. In other words, the "3rd layer" indicates dielectric film 2003 ($Al_2O_3$ film). In addition, the "6th layer" shown in FIG. 29 is the sixth one of the dielectric films included in dielectric multilayer film 2000, counting from the resonator 160 side of nitride semiconductor 100. In other words, the "6th layer" indicates dielectric film 2006 ($Al_2O_3$ film). Moreover, the letter "n" denotes the refractive index of dielectric films 2003 and 2006. Specifically, amorphous dielectric films 2003 and 2006 have the refractive index of 1.65, and crystallized dielectric films 2003 and 2006 have the refractive index of 1.76. Crystallization of 50% indicates that a half (e.g., a part on the resonator face 160 side) of dielectric film 2006 is amorphous, and the other half (e.g., a part on the opposite side of the resonator face 160 side) is crystallized.

As illustrated in FIG. 29, the reflectance of dielectric multilayer film 2000 differs depending on whether dielectric films 2003 and 2006 are amorphous or crystallized. The rate of change of a reflectance at 450 nm is one-fifth (the reflectance difference is 3% for the reflectance of approximately 15%) at the maximum, but the rate of change increases with a decrease in a wavelength. The rate of change of a reflectance at 405 nm is one-third (the reflectance difference is 2% for the reflectance of approximately 6%) at the maximum.

As has been described above, crystallization of an amorphous dielectric multilayer film due to light emitted from a nitride semiconductor causes film peeling or a change in an optical property such as a reflectance without an occurrence of film peeling. This may change a property of an output, etc. of light emitted by a nitride semiconductor light-emitting element. For example, when a nitride semiconductor light-emitting element emits laser light by using external resonance, crystallization of a dielectric multilayer film during driving gradually reduces the gain produced by the external resonance. For this reason, a dielectric multilayer film is required to have optical properties that do not readily change (i.e., stability). In other words, improvement in reliability of nitride semiconductor light-emitting elements is more desired compared to the reliability of conventional nitride semiconductor light-emitting elements.

The structure disclosed by PTL 1 includes a single amorphous dielectric film. This presents a problem of difficulty in controlling a reflectance.

The structure disclosed by PTL 2 includes a crystalline dielectric film that oxidizes with the passage of driving time. This presents a problem of a change in the refractive index of the dielectric film. Moreover, resulting from a dangling bond formed on an interface, the crystalline dielectric film presents a problem of a reduction in adhesion (e.g., a likelihood of an occurrence of film peeling) to a resonator face of a nitride semiconductor.

The structure disclosed by PTL 3 includes an amorphous dielectric film that includes an Al compound and is disposed the second in a dielectric multilayer film, counting from a resonator face side. This dielectric film presents a problem of an alteration (crystallization, etc.) due to, for example, absorption of light.

The structure disclosed by PTL 4 uses a dielectric film including a YAlN crystal. As compared to AlN, the addition of Y having large bond energy to bond to oxygen improves an oxygen barrier property (a property of trapping oxygen). For this reason, the dielectric film including YAlN oxidizes with the passage of time, and this presents a problem of a change in the refractive index of the dielectric film.

In view of the above-described problems, the present application provides a nitride semiconductor light-emitting element with improved reliability.

Hereinafter, embodiments according to the present disclosure will be described with reference to the drawings. Note that the embodiments described below each show a specific example of the present disclosure. The numerical values, shapes, materials, elements, the arrangement and connection of the elements, etc., in the following embodiments are mere examples, and therefore do not intend to limit the present disclosure.

Moreover, the drawings each are a schematic diagram, and do not necessarily provide strictly accurate illustration. Accordingly, the drawings do not necessarily coincide with one another in terms of scales and the like. Throughout the drawings, the same reference numeral is given to substantially the same element, and thus redundant description may be omitted or simplified.

In addition, in the present description, the terms "above" and "below" do not refer to the vertically upward direction and vertically downward direction in terms of absolute spatial recognition, but are used as terms defined by relative positional relationships based on the layering order in a layered configuration. Moreover, the terms "above" and "below" are applied not only when two elements are disposed spaced apart with another element interposed therebetween, but also when the two elements are disposed in contact with each other.

In the present description and drawings, the X axis, Y axis, and Z axis represent three axes in a three-dimensional orthogonal coordinate system. In each embodiment, the Z-axis direction indicates the vertical direction, and the direction perpendicular to the Z axis (a direction parallel to the X-Y plane) indicates the horizontal direction. Note that the positive direction of the Z axis indicates the vertically upward direction.

In addition, in the present description, layering indicates that two layers are layered, and applies to the case where the two layers (or films) are in contact with each other and also to the case where the two layers are not in contact with each other.

Moreover, in the present description, the layering direction of the layered structure of a nitride semiconductor is described as the Z-axis direction, and the layering direction of the multilayered structure of a dielectric multilayer film is described as the X-axis direction.

Embodiment

[Structure]

[Nitride Semiconductor Light-Emitting Element]

Figure 1:
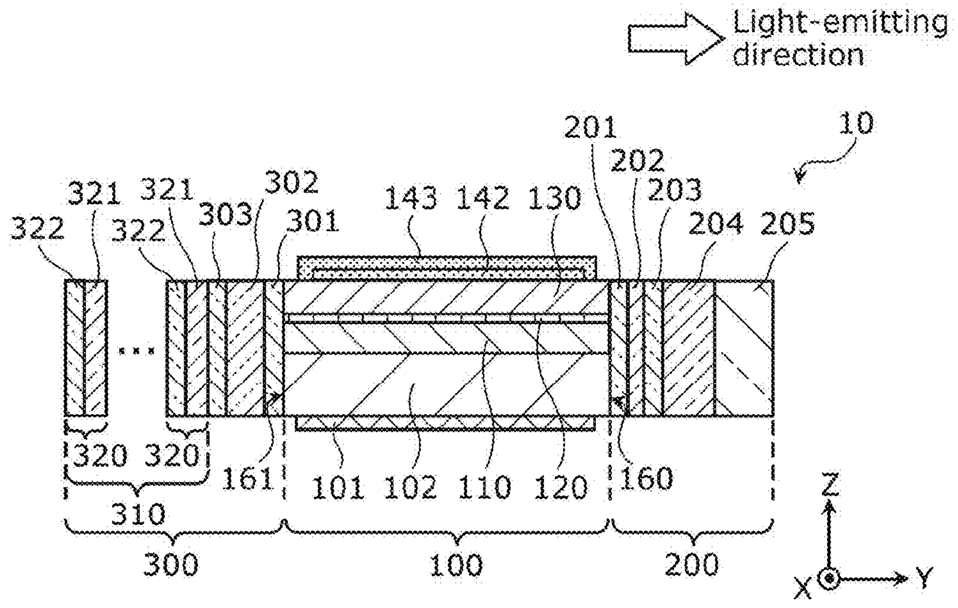
FIG. 1 is a cross sectional view schematically illustrating a configuration of a nitride semiconductor light-emitting element according to an embodiment.

FIG. 1 is a cross sectional view schematically illustrating a configuration of nitride semiconductor light-emitting element 10 according to an embodiment.

Nitride semiconductor light-emitting element 10 is a nitride semiconductor light-emitting element that emits light (more specifically, laser light).

Nitride semiconductor light-emitting element 10 includes nitride semiconductor 100 that emits light (more specifically, laser light), and dielectric multilayer films 200 and 300 provided in contact with respective resonator faces 160 and 161 of the nitride semiconductor.

Resonator face 160 is the so-called front-side end face from which light is emitted and on which dielectric multilayer film (first dielectric multilayer film) 200 is disposed.

Resonator face 161 is the so-called rear-side end face which reflects light and on which dielectric multilayer film (second dielectric multilayer film) 300 is disposed.

For example, light resonated between resonator face 160 and resonator face 161 is emitted from resonator face 160. Alternatively, when nitride semiconductor light-emitting element 10 emits laser light by using external resonance, light resonated between resonator face 161 and an optical system (e.g., coupler 450 shown in FIG. 13 that will be described later) such as a half mirror is emitted from resonator face 160.

[Nitride Semiconductor]

Nitride semiconductor 100 is a nitride-based semiconductor including two resonator faces 160 and 161 that are opposed to each other. Nitride semiconductor 100 is, for example, a layered body including a plurality of semiconductor layers. In this embodiment, nitride semiconductor 100 includes gallium nitride-based materials that are one example of nitride materials. With this, appropriate setting of an input current and an input voltage to be input to nitride semiconductor 100 implements nitride semiconductor 100 having an optical property of emitting laser light that has a wavelength in a band ranging from about 370 nm to about 430 nm and has a W-class (e.g., at least 1 W) optical output, for example. The wavelength (i.e., oscillation wavelength of nitride semiconductor 100) of light emitted from nitride semiconductor 100 can be optionally set, but is at most 430 nm, for example. More specifically, nitride semiconductor 100 emits laser light whose peak wavelength is at most 430 nm.

For example, nitride semiconductor 100 has a hexagonal crystal structure. At least one of resonator faces 160 and 161 is an m-plane among hexagonal crystal planes. In this embodiment, resonator faces 160 and 161 are both m-planes.

Note that the optical properties of nitride semiconductor light-emitting element 10 are not limited to the above-described optical properties. For example, nitride semiconductor light-emitting element 10 may be formed by optionally setting an input current, input power, a stripe width (ridge width), a resonator length, and the like for nitride semiconductor 100, such that nitride semiconductor light-emitting element 10 can output light having a wavelength in an optional band.

Note that nitride semiconductor 100 may be the so-called single emitter including one ridge portion (emitter) or may be the so-called multi emitter including a plurality of (e.g., about 60) ridge portions.

Figure 2:
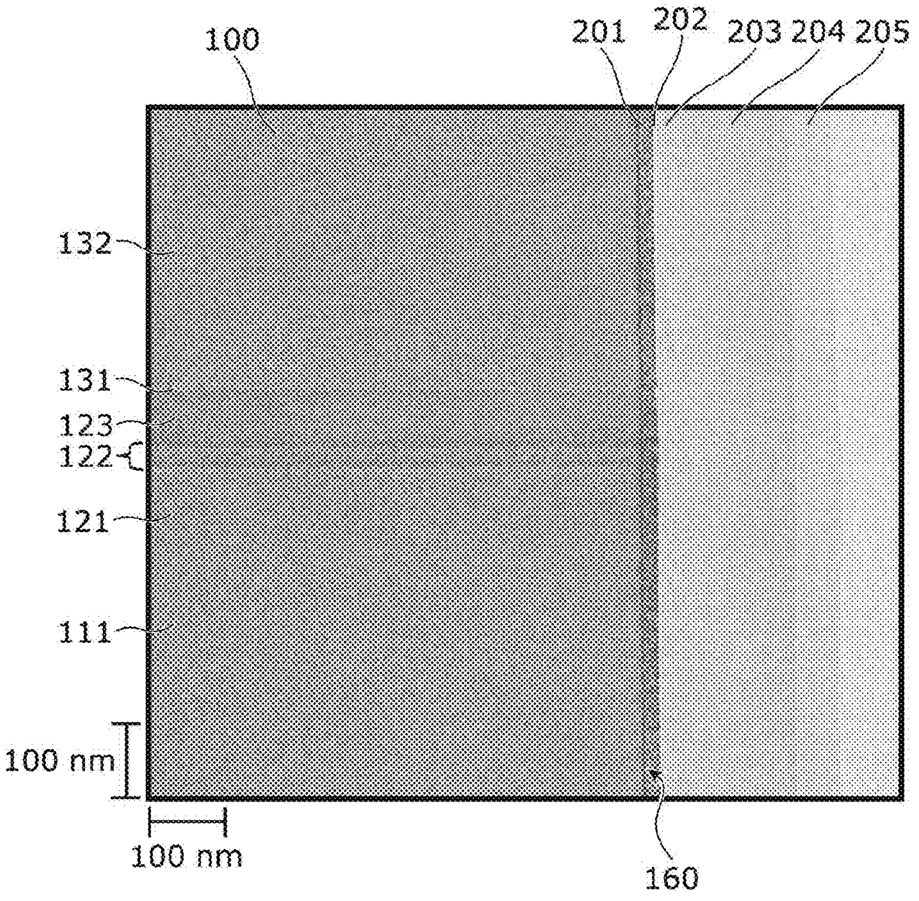
FIG. 2 is a diagram illustrating a TEM image of the nitride semiconductor light-emitting element according to the embodiment.
Figure 3:
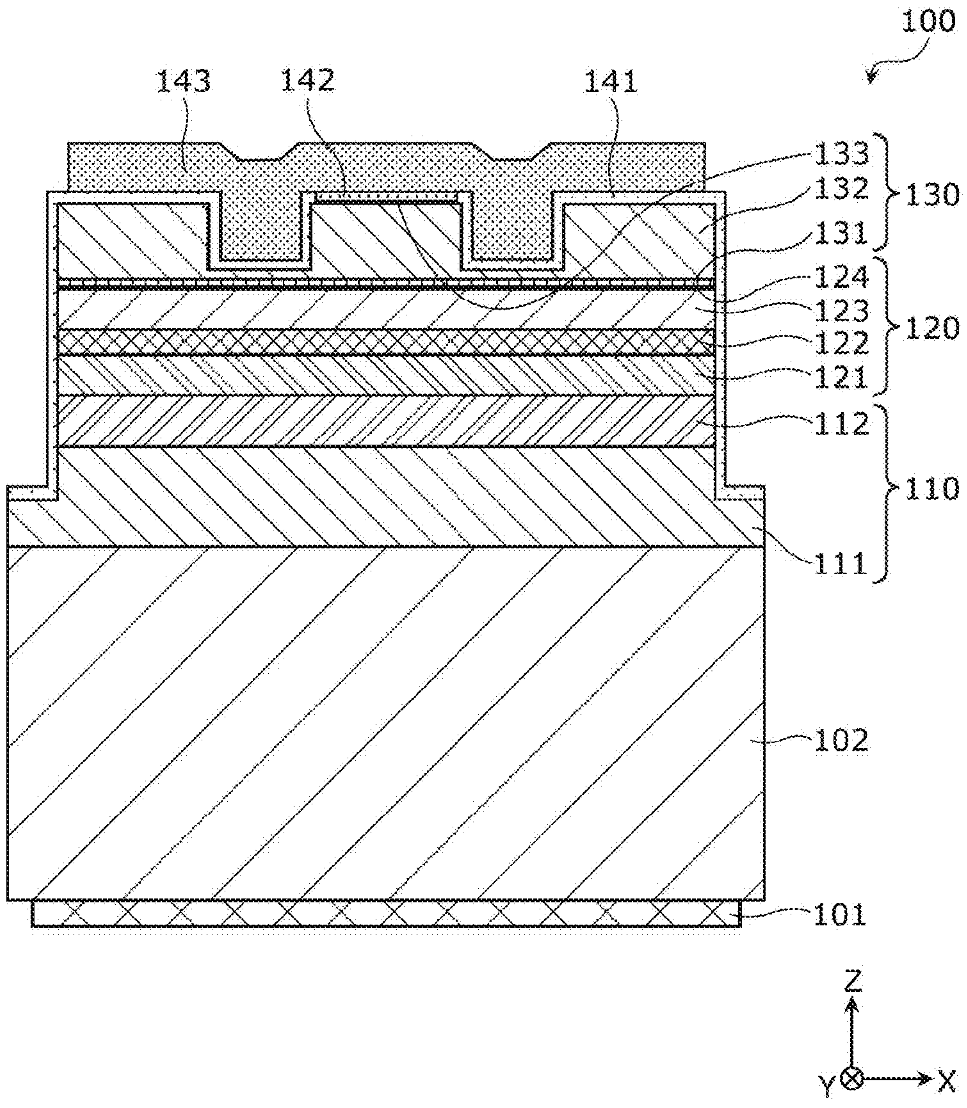
FIG. 3 is a cross sectional view illustrating a configuration of a nitride semiconductor according to the embodiment.

FIG. 2 is a diagram illustrating a TEM image of nitride semiconductor light-emitting element 10 according to the embodiment. FIG. 3 is a cross sectional view illustrating a configuration of nitride semiconductor 100 according to the embodiment. FIG. 4 is a table showing the configuration of nitride semiconductor 100 according to the embodiment.

As illustrated in FIG. 3, nitride semiconductor 100 includes N-side electrode 101, base 102, N-type nitride semiconductor layer 110, light-emitting layer 120, P-type nitride semiconductor layer 130, current block layer 141, P-side electrode (ohmic electrode) 142, and pad electrode 143.

N-side electrode 101 is an electrode disposed on the bottom face of base 102. N-side electrode 101 is a layered film in which Ti, Pt, and Au are layered in the stated order from the base 102 side, for example.

Base 102 is a plate-like member that is a base material of nitride semiconductor 100. In this embodiment, base 102 is an n-type GaN monocrystalline base having a thickness of 85 μm.

N-type nitride semiconductor layer 110 is an N-type semiconductor layer disposed (i.e., layered) on the top face of base 102.

N-type nitride semiconductor layer 110 includes N cladding layer 111 and N guiding layer 112.

N cladding layer 111 is layered on base 102, and includes AlGaN. For example, N cladding layer 111 includes an N-type AlGaN layer that has a film thickness of 3 μm and whose concentration of Si that is an n-type dopant (impurity) is $1\times10^{18}$ $cm^{-3}$.

N guiding layer 112 is layered on N cladding layer 111, and includes GaN. For example, N guiding layer 112 includes an N-type GaN layer that has a film thickness of 127 nm and whose concentration of Si is $1\times10^{18}$ $cm^{-3}$.

Light-emitting layer 120 is layered on N-type nitride semiconductor layer 110, and emits light.

Light-emitting layer 120 includes N-side guiding layer 121, active layer 122, P-side guiding layer 123, and intermediate layer 124.

N-side guiding layer 121 is layered on N guiding layer 112, and includes InGaN. For example, N-side guiding layer 121 includes undoped $In_{0.008}Ga_{0.992}N$.

Active layer 122 is layered on N-side guiding layer 121, and includes InGaN. For example, active layer 122 includes undoped $In_{0.066}Ga_{0.934}N$ and undoped $In_{0.008}Ga_{0.992}N$. In this embodiment, active layer 122 is a quantum well active layer in which a well layer and a barrier layer are alternately layered. Active layer 122 includes two well layers. With the above-described active layer 122, nitride semiconductor light-emitting element 10 can emit blue-violet laser light having the center wavelength of about 405 nm.

P-side guiding layer 123 is layered on active layer 122, and includes InGaN. For example, P-side guiding layer 123 includes undoped $In_{0.003}Ga_{0.997}N$.

Intermediate layer 124 is layered on P-side guiding layer 123, and includes InGaN/GaN. Intermediate layer 124 is configured such that the In composition ratio gradually reduces from the P-side guiding layer 123 side toward an upward direction.

P-type nitride semiconductor layer 130 is a P-type semiconductor layer layered on light-emitting layer 120.

N-type nitride semiconductor layer 110, light-emitting layer 120, and P-type nitride semiconductor layer 130 form a waveguide that is a light guiding portion. The waveguide is a portion through which light is guided inside nitride semiconductor 100. The waveguide includes a portion of N-type nitride semiconductor layer 110, a portion of light-emitting layer 120, and a portion of P-type nitride semiconductor layer 130.

P-type nitride semiconductor layer 130 includes electron barrier layer 131, P cladding layer 132, and contact layer 133.

Electron barrier layer 131 is layered on light-emitting layer 120, and includes AlGaN. Electron barrier layer 131 is configured such that the Al composition ratio gradually increases from the light-emitting layer 120 side toward an upward direction. For example, electron barrier layer 131 has a composition gradient in which the Al composition ratio changes from 4% to 36%.

P cladding layer 132 is layered on electron barrier layer 131, and includes AlGaN. P cladding layer 132 includes, for example, a first layer layered on electron barrier layer 131, and a second layer layered on the first layer and having the impurity concentration lower than the impurity concentration of the first layer. For example, P cladding layer 132 includes the first layer including $Al_{0.026}Ga_{0.974}N$ whose concentration of Mg that is a P-type dopant is $2\times10^{18}$ $cm^{-3}$, and the second layer including $Al_{0.026}Ga_{0.974}N$ whose concentration of Mg is $1\times10^{19}$ $cm^{-3}$.

In addition, a striped ridge portion for trapping a current and light in P cladding layer 132 is formed in P cladding layer 132 in this embodiment. A region of light-emitting layer 120 (a region of light-emitting layer 120 below the ridge portion) corresponding to the ridge portion is a light emitting point from which light is emitted.

Contact layer 133 is a P-type semiconductor layer that makes an ohmic contact with P-side electrode 142. Contact layer 133 is layered on P cladding layer 132, and includes GaN. Contact layer 133 includes, for example, a first layer layered on P cladding layer 132, and a second layer layered on the first layer and having the impurity concentration higher than the impurity concentration of the first layer. For example, contact layer 133 includes GaN to which the Mg concentration of at least $2\times10^{19}$ $cm^{-3}$ is added.

Current block layer 141 is a film that covers side walls of a ridge portion, side faces of P-type nitride semiconductor layer 130, side faces of light-emitting layer 120, etc., and has electrical insulation such as a $SiO_2$ film.

P-side electrode 142 is an ohmic electrode layered on contact layer 133. P-side electrode 142 is a layered film in which palladium (Pd) and platinum (Pt) are layered in the stated order from the contact layer 133 side, for example.

Pad electrode 143 is a pad-like electrode layered on P-side electrode 142, and is provided for receiving externally supplied electric power. Pad electrode 143 is a layered film in which chromium (Cr) or titanium (Ti), Pt, and gold (Au) are layered in the stated order from the P-side electrode 142 side, and is disposed on and in the vicinity of a ridge portion. Cr or Ti is provided to increase the adhesion between pad electrode 143 and P-side electrode 142.

Note that materials, In compositions or Al compositions, film thicknesses, and impurity concentrations indicated for respective layers shown in FIG. 4 are mere examples. Accordingly, these layers are not limited to the table shown in FIG. 4. For example, the thickness of base 102 is not limited to 85 μm. The thickness of base 102 may be at least 50 μm and at most 120 μm, for example. Moreover, a material included in base 102 is not limited to a GaN monocrystal, for example. Base 102 may include sapphire, SiC, etc. In addition, the configuration of active layer 122 is not limited to the above-described configuration, as long as active layer 122 is a quantum well active layer that includes alternately layered well and barrier layers, for example. Active layer 122 may be a single quantum well active layer including a single well layer and a barrier layer above and below the single well layer. Moreover, P cladding layer 132 may be a superlattice layer in which a layer including AlGaN and a layer including GaN are alternately layered, for example.

[Dielectric Multilayer Film]

Dielectric multilayer film 200 and dielectric multilayer film 300 are protective films disposed on resonator face 160 and resonator face 161 of nitride semiconductor 100, respectively. Specifically, dielectric multilayer film 200 and dielectric multilayer film 300 protect resonator face 160 and resonator face 161 of nitride semiconductor 100, respectively, and control the reflectance of light at resonator faces 160 and 161.

Note that a dielectric multilayer film is to be disposed on at least one of resonator faces 160 and 161.

Dielectric multilayer film 200 is a multilayer film that is disposed in contact with resonator face 160 that is an end face (the front-side end face) on the side from which nitride semiconductor 100 emits light, and is provided for reducing a reflectance.

Figures 5, 6:
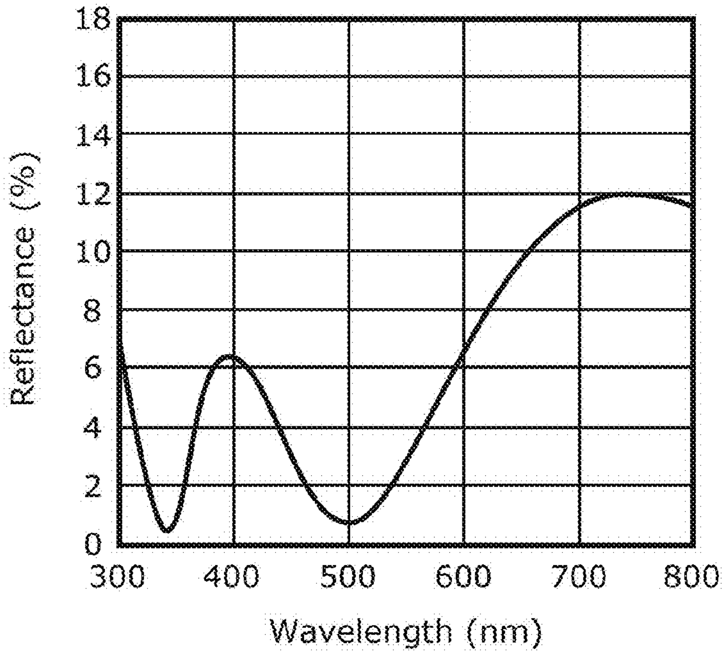
FIG. 5 is a table showing a configuration of a dielectric multilayer film according to the embodiment.
FIG. 6 is a graph indicating wavelength dependence of a reflectance at the resonator face on the light-emitting side of the nitride semiconductor light-emitting element according to the embodiment.

FIG. 5 is a table showing a configuration of dielectric multilayer film 200 according to the embodiment.

Dielectric multilayer film 200 includes, from the resonator face 160 side, dielectric film (first dielectric film) 201, dielectric film (second dielectric film) 202, dielectric film (third dielectric film) 203, dielectric film (fourth dielectric film) 204, and dielectric film (second optical film) 205 in the stated order.

Dielectric film 201 is a film that is layered on resonator face 160, and includes aluminum oxynitride to which at least one of chemical elements of yttrium (Y) or lanthanum (La) is added. In this embodiment, dielectric film 201 includes YAlON. In addition, dielectric film 201 is a crystalline film. A crystalline film is a film whose entirety is crystallized. In other words, dielectric film 201 is crystallized at the time of film formation by deposition (in other words, at a time point at which nitride semiconductor light-emitting element is manufactured).

Dielectric film 202 is a film that is layered on dielectric film 201, and includes aluminum oxide to which at least one of chemical elements of yttrium or lanthanum is added. Aluminum oxide is a composition expressed by $AlO_x$, where x>0, and is exemplified by AlO, $Al_2O_3$, $Al_2O$, etc. In this embodiment, dielectric film 202 includes $YAl_2O_3$. In addition, dielectric film 202 is amorphous (amorphous film).

Dielectric film 203 is a film that is layered on dielectric film 202, and includes aluminum oxynitride to which at least one of chemical elements of yttrium or lanthanum is added. In this embodiment, dielectric film 203 includes YAlON. Note that dielectric film 203 may be a crystalline film or amorphous. In this embodiment, at least a portion of dielectric film 203 is crystallized. In other words, at least a portion of dielectric film 203 is crystallized at the time of film formation by deposition (i.e., at a time point at which nitride semiconductor light-emitting element 10 is manufactured).

Note that dielectric film 203 may include a crystal having the crystal structure and crystal orientation the same as the crystal structure and crystal orientation of a crystal included in dielectric film 201, or may include a crystal having at least one of the crystal structure or crystal orientation different from the crystal structure and crystal orientation of the crystal included in dielectric film 201. A difference in the crystal structure indicates that the so-called crystallinity is different. For example, a difference in the crystal structure indicates a difference in atomic bonding, atomic arrangement, and the like. For example, a difference in the crystal structure is a difference in the degree of crystallization (e.g., the ratio of an amorphous phase to a crystal phase), a difference in the density, a difference in the average crystal grain size, and the like. In addition, a difference in the orientation indicates a difference among main orientations when the entirety of a dielectric film is viewed. Details of a difference in at least one of the crystal structure or crystal orientation between the crystal included in dielectric film 203 and the crystal included in dielectric film 201 will be described later.

Dielectric film 204 is a film that is layered on dielectric film 203, and includes aluminum oxide to which at least one of chemical elements of yttrium or lanthanum is added. In this embodiment, dielectric film 204 includes $YAl_2O_3$. In addition, dielectric film 204 is amorphous.

Dielectric film 205 is a film that is layered on dielectric film 204, and includes silicon oxide. Silicon oxide is a composition expressed by $SiO_x$, where x>0, and is exemplified by SiO, $SiO_2$, etc. In this embodiment, dielectric film 205 includes $SiO_2$.

Note that dielectric film 205 (i.e., a film including silicon oxide) may be layered on at least any of dielectric film 201, dielectric film 202, dielectric film 203, or dielectric film 204. In this embodiment, dielectric film 205 is disposed farthest from resonator face 160 (i.e., the outermost film) among a plurality of films (dielectric films 201 through 205) included in dielectric multilayer film 200.

In addition, dielectric film 205 (i.e., a film including silicon oxide) may be layered on at least any of dielectric film 301, dielectric film 302, or dielectric film 303.

FIG. 6 is a graph indicating wavelength dependence of a reflectance at a resonator face (resonator face 160) on the light-emitting side of nitride semiconductor light-emitting element 10 according to the embodiment. Specifically, FIG. 6 is a graph indicating a reflectance for a wavelength of light at the interface between dielectric multilayer film 200 and resonator face 160.

As illustrated in FIG. 6, dielectric multilayer film 200 has a reflectance of at most 10% in the vicinity of 400 nm that is taken as the center wavelength of light to be emitted by nitride semiconductor 100, for example.

Dielectric multilayer film 300 is a multilayer film that is disposed in contact with resonator face 161 that is an end face (the rear-side end face) on the side that nitride semiconductor 100 reflects light, and is provided for increasing a reflectance.

Figures 7, 8:
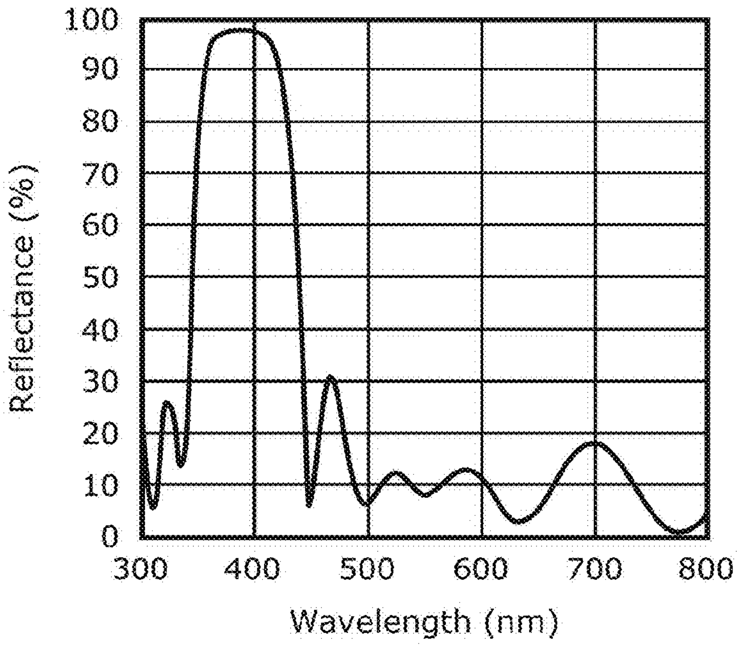
FIG. 7 is a table showing the configuration of the dielectric multilayer film according to the embodiment.
FIG. 8 is a graph indicating wavelength dependence of a reflectance at the resonator face on the light-reflecting side of the nitride semiconductor light-emitting element according to the embodiment.

FIG. 7 is a table showing the configuration of dielectric multilayer film 300 according to the embodiment.

Dielectric multilayer film 300 includes, from the resonator face 161 side, dielectric film (first dielectric film) 301, dielectric film (second dielectric film) 302, dielectric film (third dielectric film) 303, and optical interference film 310 in the stated order.

Dielectric film 301 is a film that is layered on resonator face 161, and includes aluminum oxynitride to which at least one of chemical elements of yttrium or lanthanum is added. In this embodiment, dielectric film 301 includes YAlON. In addition, dielectric film 301 is a crystalline film.

Dielectric film 302 is a film that is layered on dielectric film 301, and includes aluminum oxide to which at least one of chemical elements of yttrium or lanthanum is added. In this embodiment, dielectric film 302 includes $YAl_2O_3$. In addition, dielectric film 302 is amorphous.

Dielectric film 303 is a film that is layered on dielectric film 302, and includes aluminum oxynitride to which at least one of chemical elements of yttrium or lanthanum is added. In this embodiment, dielectric film 303 includes YAlON. Note that dielectric film 303 may be a crystalline film or amorphous. In this embodiment, at least a portion of dielectric film 303 is crystallized.

Note that dielectric film 303 may include a crystal having the crystal structure and crystal orientation the same as the crystal structure and crystal orientation of a crystal included in dielectric film 301, or may include a crystal having one of the crystal structure and crystal orientation different from the crystal structure and crystal orientation of the crystal included in dielectric film 301.

Optical interference film 310 is a multilayer film layered on dielectric film 303. Optical interference film 310 includes two or more multilayer coating films 320. Specifically, dielectric multilayer film 300 includes at least two multilayer coating films 320 that are sequentially and repeatedly formed by deposition. Multilayer coating films 320 each are a set of first coating film 321 and second coating film 322 layered on first coating film 321.

Multilayer coating film 320 includes first coating film 321 and second coating film 322 layered on first coating film 321.

In addition, first coating film 321 is a dielectric film including silicon oxide. In this embodiment, first coating film 321 includes $SiO_2$.

Second coating film 322 is a dielectric film that includes aluminum oxynitride to which at least one of chemical elements of yttrium or lanthanum is added. In this embodiment, second coating film 322 includes YAlON. Note that second coating film 322 may be a crystalline film or amorphous.

As described above, optical interference film 310 is a multilayer film in which first coating film 321 and second coating film 322 are alternately layered.

Note that optical interference film 310 includes eight multilayer coating films 320 in this embodiment. However, the number of multilayer coating films 320 to be included in optical interference film 310 is not particularly limited as long as dielectric multilayer film 300 includes a plurality of multilayer coating films 320.

In addition, optical interference film 310 may include the outermost film (a film disposed farthest from resonator face 161) that includes $SiO_2$ (i.e., first coating film 321). For example, in this embodiment, the outermost layer (the outermost film) of optical interference film 310 is the 19th layer and is second coating film 322, but optical interference film 310 may further include first coating film 321 as the 20th layer.

In order to obtain a high reflectance, it is desirable that the outermost film has a high refractive index. In contrast, in order to obtain a low reflectance, it is desirable that the outermost film has a low refractive index. For this reason, dielectric multilayer film 200 adopts dielectric film 205 including $SiO_2$ having a low refractive index as the outermost film, and dielectric multilayer film 300 adopts a film including YAlON having a high refractive index as the outermost film.

FIG. 8 is a graph indicating wavelength dependence of a reflectance at the resonator face (resonator face 161) on the light-reflecting side of nitride semiconductor light-emitting element 10 according to the embodiment. Specifically, FIG. 8 is a graph indicating a reflectance for a wavelength of light at the interface between dielectric multilayer film 300 and resonator face 161.

As illustrated in FIG. 8, dielectric multilayer film 300 has a reflectance of at least 90% at a wavelength of at least 380 nm to at most 420 nm which is taken as the center wavelength of light to be emitted by nitride semiconductor 100, for example. In other words, a reflectance at resonator face 161 on which dielectric multilayer film 300 is layered is, for example, at least 90%.

In addition, dielectric film 201 has the oxygen concentration of at least 2 atom % and at most 13.4 atom %, for example.

Figure 9:
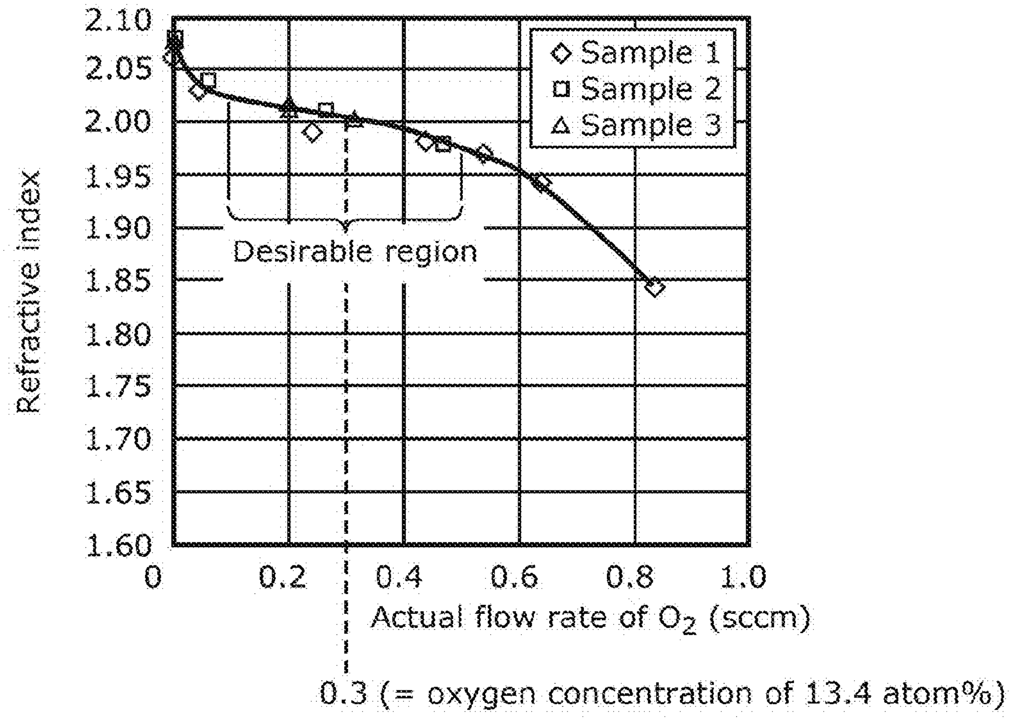
FIG. 9 is a graph indicating an optical property of AlON.

FIG. 9 is a graph indicating an optical property of AlON. More specifically, FIG. 9 is a graph plotting refractive indices of AlON for respective flow rates of oxygen (actual flow rates of $O_2$ (sccm)), where the flow rate of argon (Ar) and the flow rate of $N_2$ are fixed at 30 cc and 4.9 cc, respectively, when an AlON film is formed. Note that an AlN film is formed when the actual flow rate of $O_2$ is zero.

As illustrated in FIG. 9, the refractive index is stable, or in other words, the refractive index does not readily change in relation to the change in the flow rate of oxygen, when the flow rate of oxygen is in the range of from 0.1 cc to 0.5 cc. The oxygen concentration of a film that is formed when the flow rate of oxygen is 0.3 cc, namely the center of the above-mentioned condition, is 13.4 atom %, and the oxygen concentration of a film formed when the flow rate of oxygen is 0.1 cc is 2 atom %. Accordingly, by adjusting the flow rate of oxygen such that the oxygen concentration of a film to be formed is 13.4 atom %, a change in the refractive index in relation to a change in the flow rate of oxygen can be prevented. In addition, when nitride semiconductor light-emitting element 10 is driven, the oxygen concentrations in dielectric multilayer films 200 and 300 increase during driving. For this reason, setting the oxygen concentration of dielectric film 201 to at most 13.4 atom % can prevent a change in the refractive index due to an increase in the oxygen concentration caused by driving.

Note that dielectric film 203, 301, and 303 each may also have the oxygen concentration of at least 2 atom % and at most 13.4 atom %.

Moreover, as described above, dielectric films 201 and 301 each include a crystal having a hexagonal crystal structure, for example. In addition, as described above, resonator faces 160 and 161 are both m planes, for example. Here, for example, the c-axis of a crystal included in each of dielectric films 201 and 301 is perpendicular to at least one resonator face of resonator faces 160 and 161.

Figure 10:
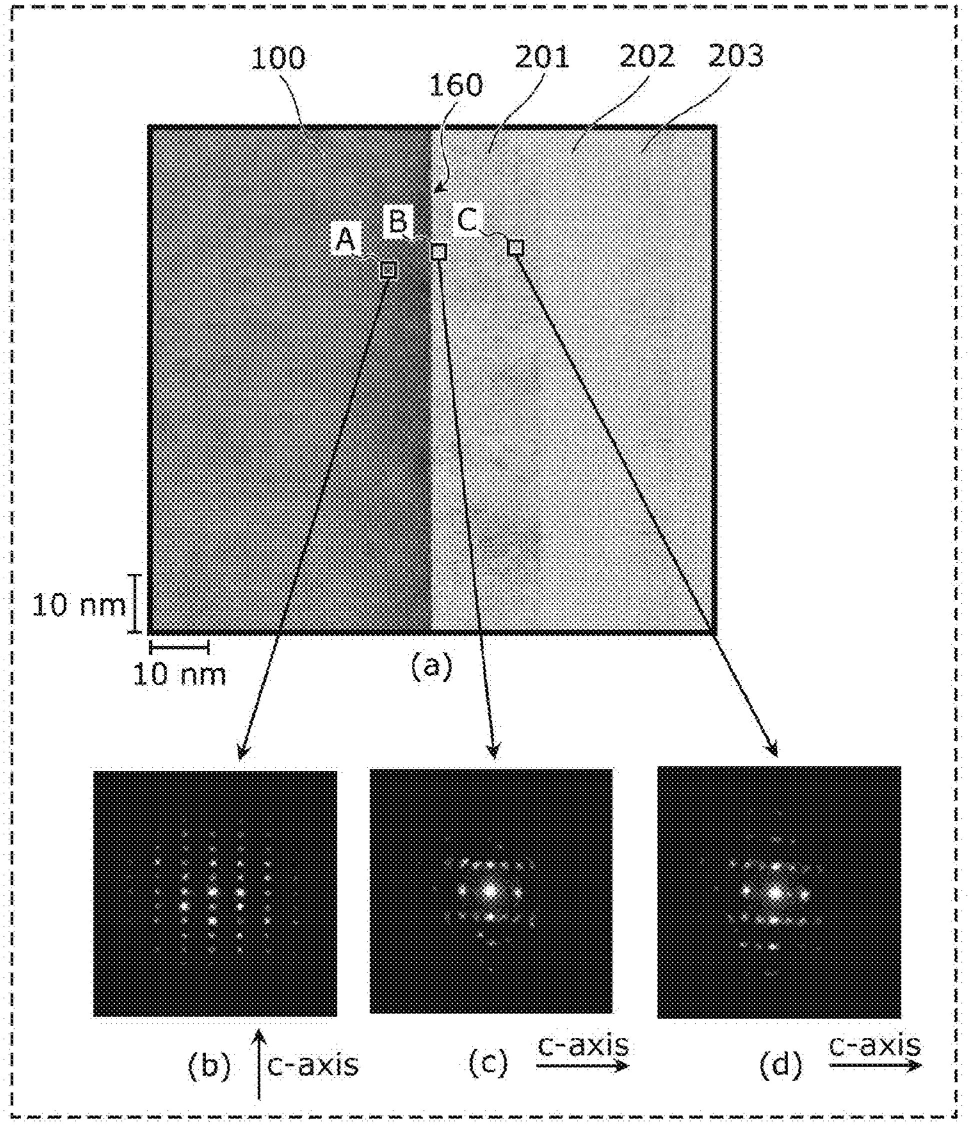
FIG. 10 is a diagram illustrating a TEM image of the nitride semiconductor light-emitting element according to the embodiment.

FIG. 10 is a diagram illustrating a TEM image of nitride semiconductor light-emitting element 10 according to the embodiment. Specifically, part (a) of FIG. 10 is the TEM image of nitride semiconductor light-emitting element 10. Part (b) of FIG. 10 is a diagram illustrating the electron diffraction pattern at position A. Part (c) of FIG. 10 is a diagram illustrating the electron diffraction pattern at position B. Part (d) of FIG. 10 is a diagram illustrating the electron diffraction pattern at position C. Note that FIG. 10 shows an example of a film that is formed by deposition using an ECR sputtering method. The ECR sputtering method uses an Al target that is a solid solution made by mixing Y with 0.1 wt. % of aluminum (Al).

As illustrated in part (b) of FIG. 10, nitride semiconductor 100 has the c-axis oriented in the up-down direction of the plane. More specifically, nitride semiconductor 100 has the c-axis oriented in the upward direction of the plane in the vicinity of resonator face 160. In contrast, as illustrated in part (c) and part (d) of FIG. 10, dielectric film 201 has an electron diffraction pattern that is 90° rotated from the electron diffraction pattern of nitride semiconductor 100. Specifically, dielectric film 201 has the c-axis oriented in the left-right direction irrespective of position. In other words, the c-axis of a crystal included in dielectric film 201 is perpendicular to resonator face 160.

Note that the term "perpendicular" used above not only means a direction that is perfectly perpendicular, but also includes a direction within a range of manufacturing tolerances. For example, the term "perpendicular" used above not only means that the angle formed by two c-axes is 90°, but also means the inclusion of an error of from about ±5% to about ±10%.

In addition, the orientation direction of dielectric film 201 may be different depending on positions.

Dielectric multilayer films 200 and 300 have, for example, the above-described configurations, but their configurations are not limited to the above-described configurations.

For example, among the dielectric films included in dielectric multilayer films 200 and 300, a dielectric film to which yttrium is added may be a dielectric film to which lanthanum is added instead of yttrium or may be a dielectric film to which lanthanum is added together with yttrium.

Note that the sum of an yttrium concentration and a lanthanum concentration of dielectric film 201 and dielectric film 202 is not particularly limited, but is, for example, at most 0.4 atom % for each of dielectric film 201 and dielectric film 202.

Figure 11:
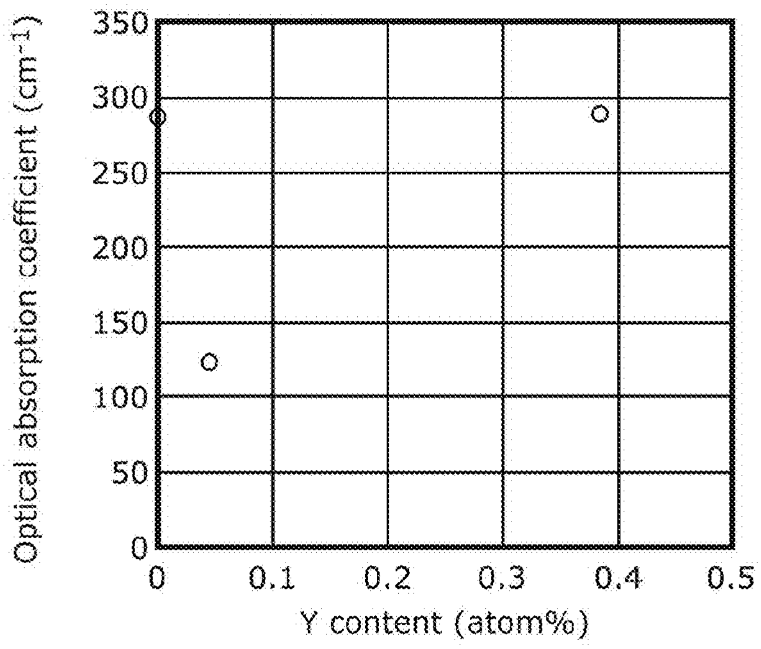
FIG. 11 is a graph indicating an optical property of YAlON at 405 nm.
Figure 12:
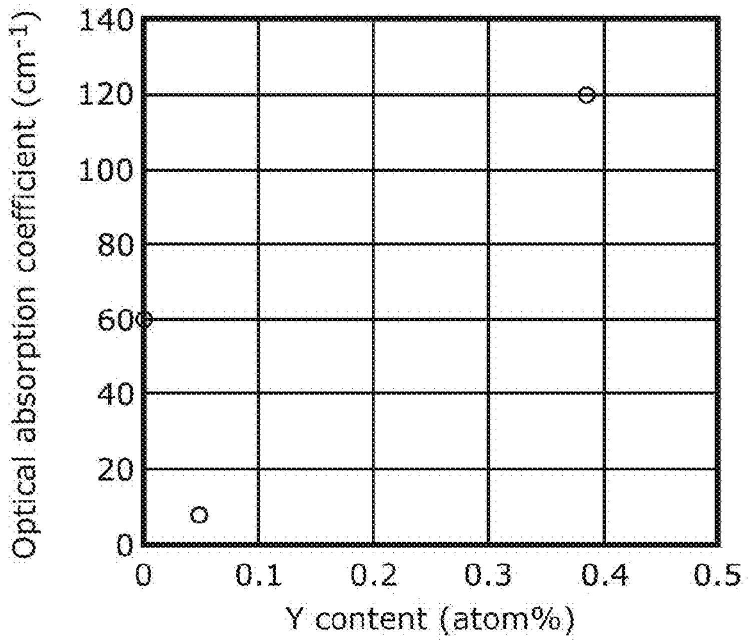
FIG. 12 is a graph indicating an optical property of $YAl_2O_3$ at 405 nm.

FIG. 11 is a graph indicating an optical property of YAlON. Specifically, FIG. 11 is a graph indicating an optical absorption coefficient for an Y content of an AlON film at 405 nm. FIG. 12 is a graph indicating an optical property of $YAl_2O_3$. Specifically, FIG. 12 is a graph indicating an optical absorption coefficient for an Y content of an $Al_2O_3$ film at 405 nm.

An addition of Y to a dielectric film terminates a grain boundary and an oxygen defect in the dielectric film. Accordingly, an optical absorption coefficient for each of $Al_2O_3$ and AlON is reduced. However, an excessive increase in the addition amount of Y creates a cluster region in which several atoms of Y are gathered. Since these gathered atoms of Y work as light absorption sources, the optical absorption coefficient is increased. These above-described optical absorption properties are examples demonstrated at 405 nm, and show the same tendency in the range of from 370 nm to 430 nm. Particularly, an optical absorption coefficient is larger on the short wavelength side less than 405 nm even if Y is not added. Accordingly, a change in an optical absorption property on the short wavelength side due to an addition of Y is even more noticeable.

In addition, Y (and La) has a relatively large atomic radius compared to the atomic radius of Al. For this reason, when a dielectric film including a Y concentration of substantially at least 1 atom % in relation to Al is to be formed, it is difficult to form a stable solid target. From the viewpoints of light absorption and manufacturing, it is desirable that the Y concentration is at most 0.4 atom %.

[Nitride Semiconductor Light-Emitting Device]

Figure 13:
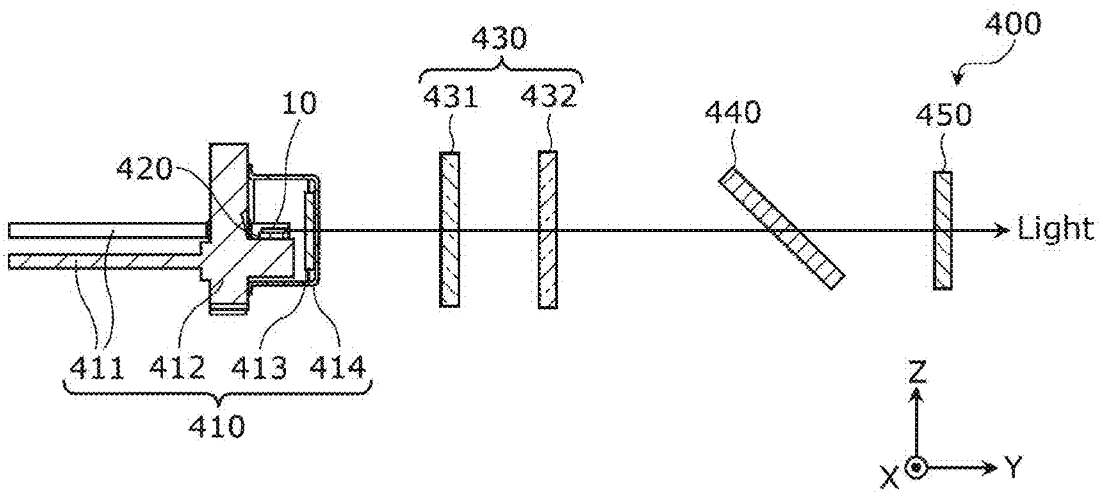
FIG. 13 is a diagram illustrating a configuration of a light-emitting device according to the embodiment.

FIG. 13 is a diagram illustrating a configuration of light-emitting device 400 according to the embodiment. Note that FIG. 13 illustrates a cross-section of package 410 for showing the internal configuration.

Nitride semiconductor light-emitting element 10 is used in, for example, light-emitting device 400 that uses external resonance.

Light-emitting device 400 includes nitride semiconductor light-emitting element 10, package 410, submount 420, collimator lens unit 430, diffraction grating 440, and coupler 450.

Package 410 is a casing that accommodates nitride semiconductor light-emitting element 10. Package 410 is the so-called CAN package. Package 410 includes lead pin 411, stem 412, window 413, and cap 414.

Lead pin 411 is a pin for receiving electric power supplied from outside package 410 to nitride semiconductor light-emitting element 10. Lead pin 411 is fixed to stem 412. Lead pin 411 includes, for example, a metallic material or the like having conductivity.

Stem 412 is a stand on which nitride semiconductor light-emitting element 10 is placed. In this embodiment, nitride semiconductor light-emitting element 10 is placed on stem 412 with submount 420 interposed therebetween. Stem 412 includes, for example, a metallic material or the like.

Window 413 is a light-transmissive member that is light transmissive for light that nitride semiconductor light-emitting element 10 emits. Window 413 includes, for example, a low-reflectance member or the like for which a light-transmissive resin material and a dielectric multilayer film are provided. For example, when nitride semiconductor light-emitting element 10 emits laser light having a short wavelength, a member in which a dielectric multilayer film is formed on a light-transmissive material such as glass or quartz is adopted as window 413 for preventing degradation.

Cap 414 is a member provided in contact with stem 412 so as to cover nitride semiconductor light-emitting element 10. Cap 414 is provided with a through hole. Light emitted by nitride semiconductor light-emitting element 10 passes through the through hole to be emitted outside package 410. For example, window 413 is provided so as to cover the through hole. Stem 412, window 413, and cap 414 hermetically seals nitride semiconductor light-emitting element 10, for example.

Submount 420 is a base on which nitride semiconductor light-emitting element 10 is placed. Submount 420 includes, for example, a ceramic material.

Collimator lens unit 430 is an optical member for collimating light emitted by nitride semiconductor light-emitting element 10. For example, collimator lens unit 430 includes collimator lens 431 that collimates one of the fast-axis direction and the slow-axis direction of light (more specifically, laser light) emitted by nitride semiconductor light-emitting element 10, and collimator lens 432 that collimates the other of the fast-axis direction and the slow-axis direction of the light.

Diffraction grating 440 is an optical element that disperses light collimated by collimator lens unit 430. Diffraction grating 440 includes, for example, a plurality of grooves. Diffraction grating 440 emits light by allowing the light collimated by collimator lens unit 430 to transmit through or reflect off in a different direction for each of wavelengths. In this example, diffraction grating 440 emits light by allowing the light collimated by collimator lens unit 430 to transmit through in a different direction for each of wavelengths. Diffraction grating 440 is a light-transmissive member such as glass or resin having a surface in which the above-described plurality of grooves are formed, for example.

Coupler 450 is an output coupler such as a half mirror which (i) allows a portion of light emitted by diffraction grating 440 by allowing the light to transmit through to transmit through and (ii) reflects the remaining portion of the light. The light reflected by coupler 450 transmits through diffraction grating 440 and collimator lens unit 430, and returns to nitride semiconductor light-emitting element 10. With this, the light is resonated between nitride semiconductor light-emitting element 10 and coupler 450, and the resonated light is emitted from coupler 450. Specifically, appropriate dispositions of nitride semiconductor light-emitting element 10, collimator lens unit 430, diffraction grating 440, and coupler 450 resonates light having a specific wavelength, and the light is output from light-emitting device 400.

In recent years, a large number of applications using external resonance has been proposed. Such applications fix a wavelength of light (e.g., laser light) to be emitted from a nitride semiconductor. For example, a Raman spectroscopic device or a photoluminescence device that is one example of the above-mentioned applications uses a light source whose wavelength of light is fixed, since a change in the wavelength affects an analysis result.

In addition, a high-power light-emitting device needs to multiplex a plurality of beams of laser light. From the above, a wavelength multiplexing technique for multiplexing beams of laser light having mutually different fixed wavelengths has been drawing attention, since such technique enables a high-power output while maintaining a high beam quality.

It is typically known that nitride semiconductors emit light whose wavelength changes according to operating temperatures of the nitride semiconductors. For this reason, an optical output or operating environment of the nitride semiconductors causes a change in the wavelength of light to be emitted by these nitride semiconductors. From the above, nitride semiconductors are being difficult to be used in the above-described applications that require no change in the wavelength.

Consequently, external resonance-type semiconductor laser devices that include a Fabry-Perot-type resonator that amplifies only a specific wavelength have been developed. Such a Fabry-Perot-type resonator includes a nitride semiconductor whose resonator face (front-side end face) has an absolute minimum reflectance, a wavelength selecting optical element (e.g., diffraction grating 440), and a light-emitting optical element (e.g., coupler 450) called an output coupler.

As illustrated in FIG. 13, light (e.g., laser light) emitted from nitride semiconductor light-emitting element 10 becomes parallel rays by being collimated by collimator lens unit 430 and enters diffraction grating 440. Wavelengths of the entered light are selected by a dispersion effect of diffraction grating 440. The light then enters coupler 450 that is the light-emitting face of a Fabry-Perot resonator and is disposed in a transmission direction of a desired wavelength. With this configuration, a resonator is formed between coupler 450 and resonator face 160 of nitride semiconductor 100, and the light is amplified.

Figure 14:
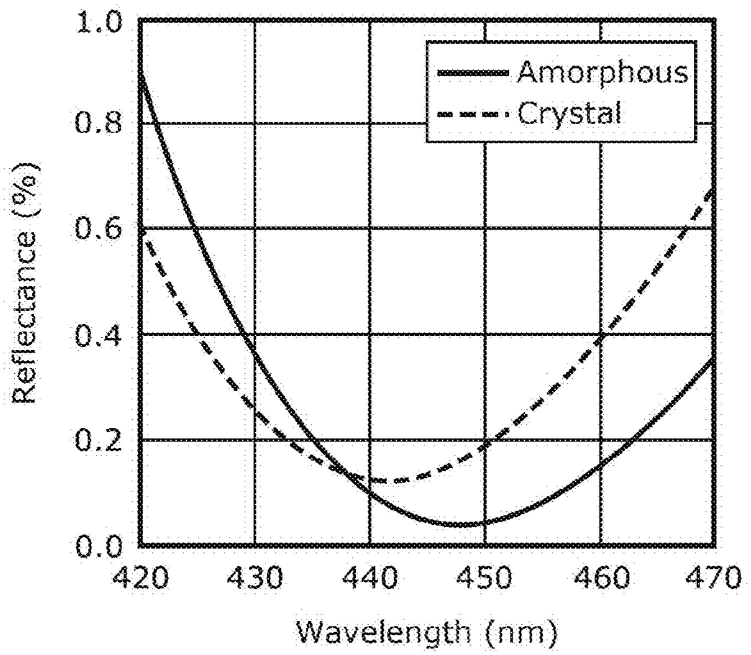
FIG. 14 is a graph indicating a first example of a reflectance spectrum of the dielectric multilayer film according to the embodiment.
Figure 15:
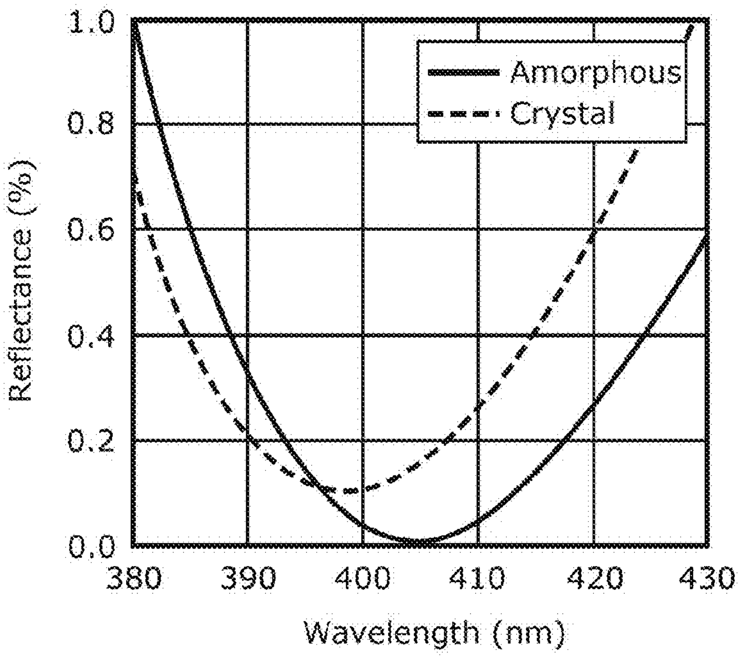
FIG. 15 is a graph indicating a second example of a reflectance spectrum of the dielectric multilayer film according to the embodiment.
Figure 16:
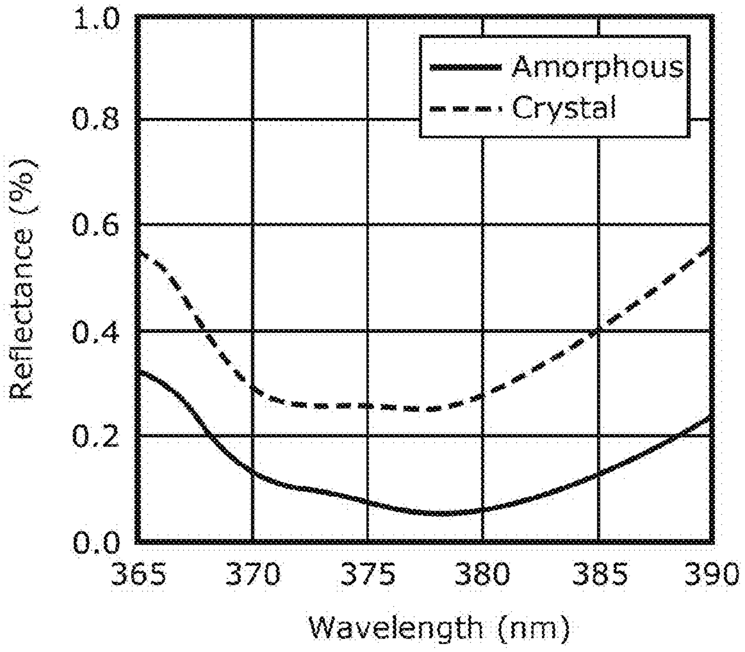
FIG. 16 is a graph indicating a third example of a reflectance spectrum of the dielectric multilayer film according to the embodiment.

FIG. 14 through FIG. 16 each are a graph indicating a reflectance spectrum of a dielectric multilayer film. Specifically, FIG. 14 is a graph indicating wavelength dependence of a reflectance at dielectric multilayer film 200 that is formed to have a low reflectance for 450 nm light. FIG. 15 is a graph indicating wavelength dependence of a reflectance at dielectric multilayer film 200 that is formed to have a low reflectance for 405 nm light. FIG. 16 is a graph indicating wavelength dependence of a reflectance at dielectric multilayer film 200 that is formed to have a low reflectance for 375 nm light. Note that FIG. 14 through FIG. 16 each are a graph of a reflectance spectrum of dielectric multilayer film 200 that includes dielectric films 202 and 204 each of which uses an $Al_2O_3$ film as its material.

Note that in FIG. 14 through FIG. 16, the dashed line denotes the wavelength dependence of a reflectance when $Al_2O_3$ films (dielectric films 202 and 204) are crystallized, and the solid line denotes the wavelength dependence of a reflectance when the $Al_2O_3$ films are amorphous.

As illustrated in FIG. 14 through FIG. 16, the wavelength dependence of a reflectance when the $Al_2O_3$ films are crystallized and the wavelength dependence of a reflectance when the $Al_2O_3$ films are amorphous are different in any case. As described above, since the wavelength dependence of a reflectance is different between a crystal and an amorphous film, crystallization of an amorphous film becomes a factor of a variation in an optical property of nitride semiconductor light-emitting element 10. Furthermore, crystallization of an amorphous film increases a reflectance. Accordingly, when an external resonator (e.g., light-emitting device 400) is intended to be used, the above-described variation in an optical property leads to optical loss, thereby reducing an optical output of light-emitting device 400.

In a semiconductor laser device that uses external resonance such as light-emitting device 400, resonator faces (faces at which resonance is produced) are the rear-side end face (resonator face 161) of nitride semiconductor light-emitting device 10 and the reflective surface of coupler 450.

For this reason, occurrences of light reflection occurred other than at the resonator faces in an optical path in which resonance is produced are all optical losses (internal losses). Accordingly, reflection occurred at the front-side end face (resonator face 160) of nitride semiconductor light-emitting element 10 is also internal loss. From the above, the front-side end face needs to have an extremely small reflectance.

Moreover, when light reflected by something other than coupler 450 returns to resonator face 161 of nitride semiconductor light-emitting element 10, the foregoing light may also be amplified due to resonance. When a reflectance of resonator face 160 of nitride semiconductor light-emitting element 10 is increased, light is amplified, not only by coupler 450, but also by resonator face 160 (resonator face of a Fabry-Perot resonator) as a resonator face. This leads to loss of wavelength fixation by diffraction grating 440, or in other words, amplification of only a specific wavelength of light cannot be performed. Furthermore, the foregoing leads to a variation in an optical output from light-emitting device 400. From the above-described reasons, a reflectance at resonator face 160 of nitride semiconductor light-emitting element 10 is required to have an extremely low reflectance that falls below 1%, and is required to have even a smaller variation. As described above, the reflectance is to be set at most 1% by, for example, setting a film thickness and the like of dielectric multilayer film 200 according to a wavelength of light to be emitted by nitride semiconductor 100. In other words, a reflectance at resonator face 160 on which dielectric multilayer film 200 is layered may be, for example, at most 1%.

When a conventional end-face protective film (e.g., dielectric multilayer film 200A and 2000) not including Y is used, a reflectance of the end-face protective film varies when nitride semiconductor light-emitting element 10 is in operation (e.g., when outputting light) due to light-induced crystallization of each of dielectric films or film peeling between the films.

As illustrated in FIG. 14 through FIG. 16, crystallization of $Al_2O_3$ often increases a reflectance of a desired wavelength. Since an increase in a reflectance increases optical loss due to resonance even if a change in the reflectance is slight, an increase in the reflectance leads to degradation of an optical property of light-emitting device 400. Furthermore, when a change in stress due to crystallization causes film peeling, degradation of an optical property of light-emitting device 400 becomes even more evident.

From the above, at least one of Y or La (in this embodiment, Y) is added to a dielectric film (e.g., dielectric film 202 and 302) including $Al_2O_3$ in dielectric multilayer films 200 and 300. This prevents light-induced crystallization of a dielectric film that includes $Al_2O_3$. Furthermore, since an addition of at least one of Y or La (in this embodiment, Y) increases the adhesion between dielectric films, an occurrence of film peeling between the dielectric films is prevented. Since this prevents a slight variation in the reflectance at dielectric multilayer films 200 and 300, nitride semiconductor light-emitting element 10 can achieve stable external resonance. As a matter of course, since a slight variation in the reflectance at dielectric multilayer films 200 and 300 can also be prevented when light is resonated between resonator faces 160 and 161, a stable resonance can be achieved.

Note that in the example shown in FIG. 13, laser light linearly transmits through diffraction grating 440 and reaches coupler 450, but the transmission of light is not limited to the above. Since light curves according to a transmission diffraction angle of diffraction grating 440, coupler 450 may be disposed at a position suitable for the diffraction angle of diffraction grating 440.

In addition, diffraction grating 440 may emit light by reflecting light collimated by collimator lens unit 430 in a different direction for each of wavelengths.

Figure 17:
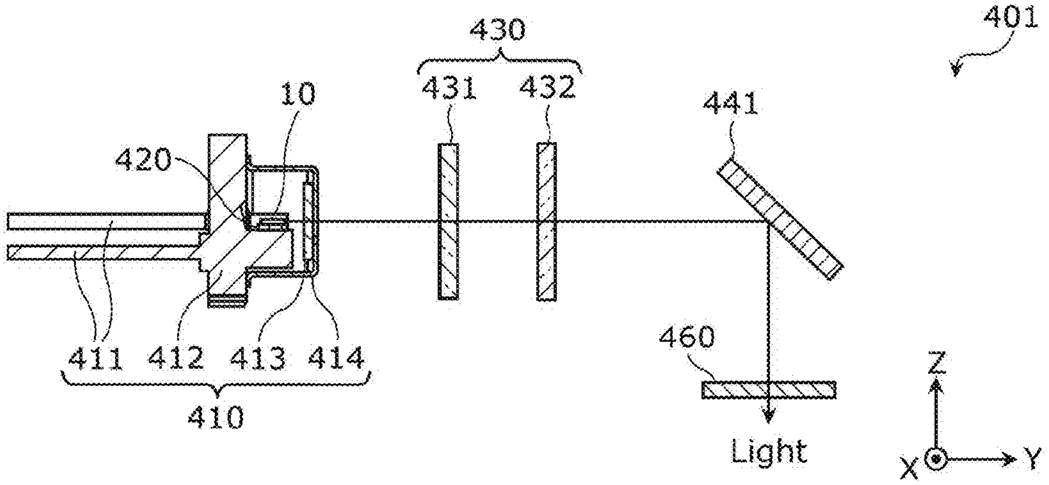
FIG. 17 is a diagram illustrating another example of a configuration of the light-emitting device according to the embodiment.

FIG. 17 is a diagram illustrating another example of a configuration of light-emitting device 401 according to the embodiment.

Light-emitting device 401 is different from light-emitting device 400 in that light-emitting device 401 includes diffraction grating 441 and coupler 460 instead of diffraction grating 440 and coupler 450.

Diffraction grating 441 emits light by reflecting light collimated by collimator lens unit 430 in a different direction for each of wavelengths. Diffraction grating 441 is a member having reflectivity such as a metallic member, and has a surface in which a plurality of grooves are formed, for example.

Coupler 460 is an output coupler such as a half mirror which (i) allows a portion of light emitted by diffraction grating 441 by reflecting the light to transmit through and (ii) reflects the remaining portion of the light.

Light is resonated between nitride semiconductor light-emitting element 10 and coupler 460 also in light-emitting device 401, and the resonated light is emitted from coupler 460 (i.e., light-emitting device 401).

Variations

Next, variations of the nitride semiconductor light-emitting element will be described.

For example, dielectric multilayer films 200 and 300 each may further include a dielectric film (first optical film) 206 between resonator face 160 and dielectric film 201 and between resonator face 161 and dielectric film 301.

Figure 18:
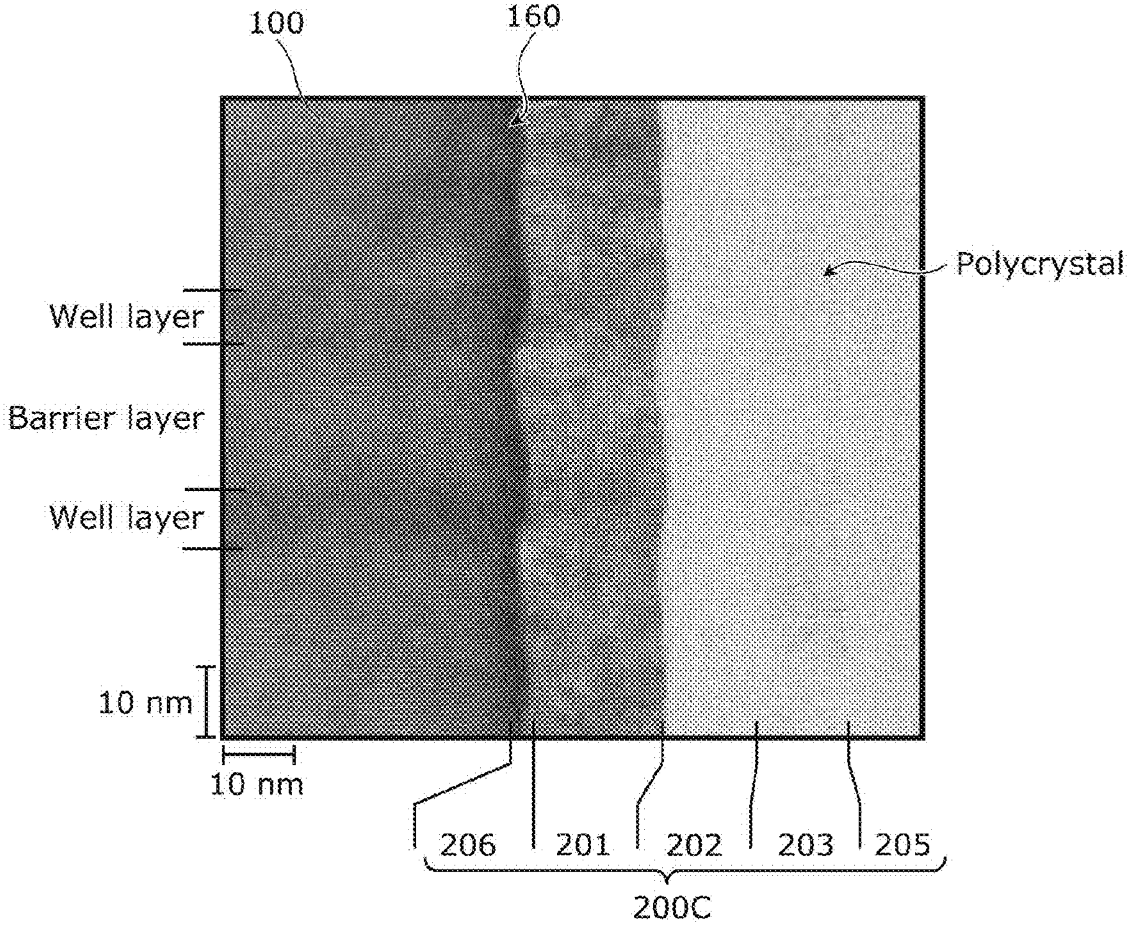
FIG. 18 is a diagram illustrating a TEM image of a nitride semiconductor light-emitting element according to Variation 1 of the embodiment.
Figure 19:
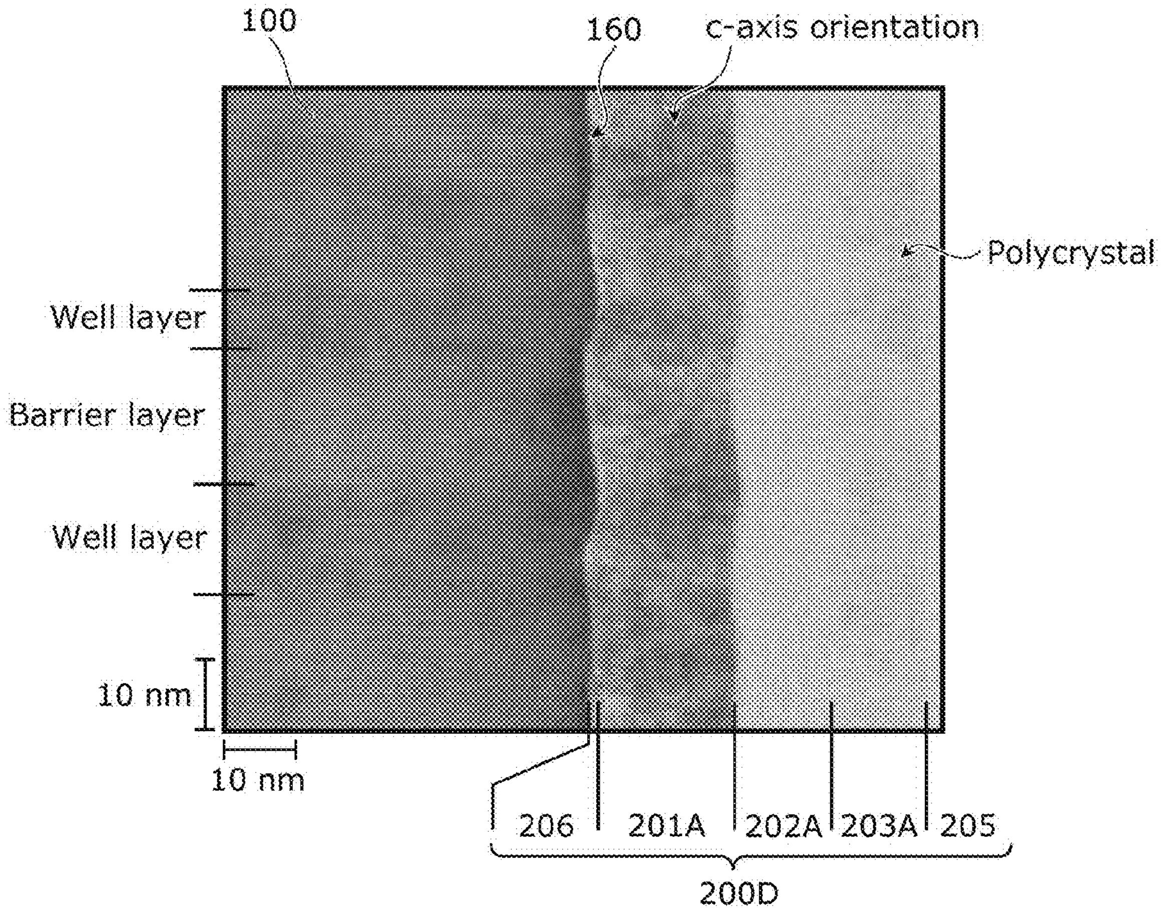
FIG. 19 is a diagram illustrating a TEM image of a nitride semiconductor light-emitting element according to comparative example 1.

FIG. 18 is a diagram illustrating a TEM image of a nitride semiconductor light-emitting element according to Variation 1 of the embodiment. FIG. 19 is a diagram illustrating a TEM image of a nitride semiconductor light-emitting element according to comparative example 1.

Dielectric multilayer film 200C included in the nitride semiconductor light-emitting element according to Variation 1 of the embodiment includes dielectric film 206 layered on resonator face 160, dielectric film 201 layered on dielectric film 206, dielectric film 202 layered on dielectric film 201, dielectric film 203 layered on dielectric film 202, and dielectric film 205 layered on dielectric film 203.

Resonator face 160 may be disposed in contact with dielectric film 201 as illustrated in FIG. 2, and may be disposed in contact with dielectric film 206 as illustrated in FIG. 18.

Dielectric film 206 is a film that is interposed between resonator face 160 and dielectric film 201 (i.e., layered on resonator face 160), and includes SiN or SiON. In this embodiment, dielectric film 206 includes SiN.

As illustrated in FIG. 19, dielectric multilayer film 200D included in the nitride semiconductor light-emitting element according to comparative example 1 includes dielectric film 206 layered on resonator face 160, dielectric film 201A layered on dielectric film 206, dielectric film 202A layered on dielectric film 201A, dielectric film 203A layered on dielectric film 202A, dielectric film 205 layered on dielectric film 203A.

As described above, dielectric film 201A includes AlON, dielectric film 202A includes $Al_2O_3$, and dielectric film 203A includes AlON. In other words, unlike dielectric films 201A, 202A, and 203A, Y is added to each of dielectric films 201, 202, and 203.

As illustrated in FIG. 19, dielectric film 206 is visually identifiable in dielectric multilayer film 200D. In other words, dielectric film 206 is visually identifiable since the SiN film is separated from the AlON film in a structure to which no Y is added. In contrast, as illustrated in FIG. 18, dielectric film 206 is not visually identifiable in dielectric multilayer film 200C. As a reason for the above, it can be considered that Si included in dielectric film 206 and Y included in dielectric film 201 formed an alloy called a silicide in the dielectric multilayer film. In other words, dielectric film 206 is not visually identifiable in a structure to which Y is added, since the SiN film is combined with the YAlON film (more specifically, a silicide is formed). The above-described formation of a silicide considerably increases the adhesion between an end face (e.g., resonator face 160) of nitride semiconductor 100 and a dielectric film (e.g., dielectric film 206).

Note that dielectric multilayer film 300 may include a film including SiN or SiON (i.e., a film having the same configuration as dielectric film 206) which is to be interposed between resonator face 161 and dielectric film 301.

Figure 20:
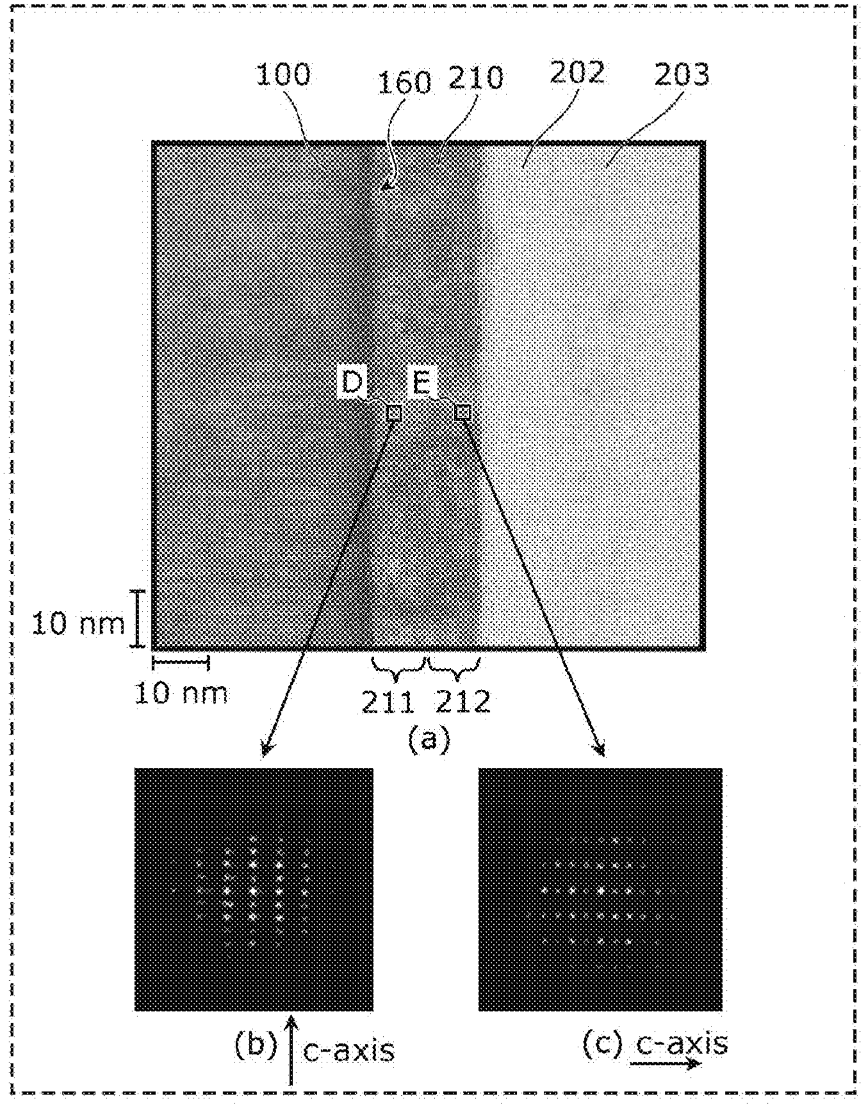
FIG. 20 is a diagram illustrating a TEM image of a nitride semiconductor light-emitting element according to Variation 2 of the embodiment.

FIG. 20 is a diagram illustrating a TEM image of a nitride semiconductor light-emitting element according to Variation 2 of the embodiment. Specifically, part (a) of FIG. 20 is a TEM image of the nitride semiconductor light-emitting element according to Variation 2. Part (b) of FIG. 20 is a diagram illustrating the electron diffraction pattern at position D. Part (c) of FIG. 20 is a diagram illustrating the electron diffraction pattern at position E. Note that FIG. 20 shows an example of a film formed by deposition using an ECR sputtering method. The ECR sputtering method uses an Al target that is a solid solution made by mixing Y with 1 wt. % of Al. First crystalline layer 211 has a thickness of approximately 10 nm.

As illustrated in FIG. 20, dielectric film 210 includes first crystalline layer 211 on the nitride semiconductor 100 side which has, like FIG. 19, the c-axis oriented in the up-down direction of the plane. In other words, the c-axis of a crystal included in first crystalline layer 211 of dielectric film 210 is parallel to resonator face 160. In contrast, dielectric film 210 includes second crystalline layer 212 on the dielectric film 202 side which has the c-axis oriented in the left-right direction of the plane. In other words, the c-axis of a crystal included in second crystalline layer 212 of dielectric film 210 is perpendicular to resonator face 160. As described above, dielectric film 201 is a crystalline film that includes a crystal having a hexagonal crystal structure, for example. Dielectric film 201 includes first crystalline layer 211 whose c-axis is parallel to resonator face 160 and second crystalline layer 212 whose c-axis is perpendicular to resonator face 160. In this case, first crystalline layer 211 is disposed closer to resonator 160 than second crystalline layer 212 is.

As has been described above, first crystalline layer 211 has the same orientation as nitride semiconductor 100, and has an epitaxial property. In contrast, second crystalline layer 212 has an orientation different from the orientation of first crystalline layer 211. As illustrated in part (a) of FIG. 20, first crystalline layer 211 and second crystalline layer 212 continuously bond together, and the interface is not clear. As a reason for the above, it can be considered that an effect of Y on adhesion improvement is greatly enhanced, since it is the interface between the layers of the same material having different orientations.

Note that dielectric film 301 may adopt the above-described configuration. In other words, dielectric film 301 is a crystalline film that includes a crystal having a hexagonal crystal structure, for example. Dielectric film 301 includes a first crystalline layer whose c-axis is parallel to resonator face 161, and a second crystalline layer whose c-axis is perpendicular to resonator 161. In this case, the first crystalline layer is disposed closer to resonator 161 than the second crystalline layer is.

In addition, a crystal included in dielectric film 203 is different from a crystal included in dielectric film 201 in at least one of the crystal structure or the crystal orientation, for example.

Figure 21:
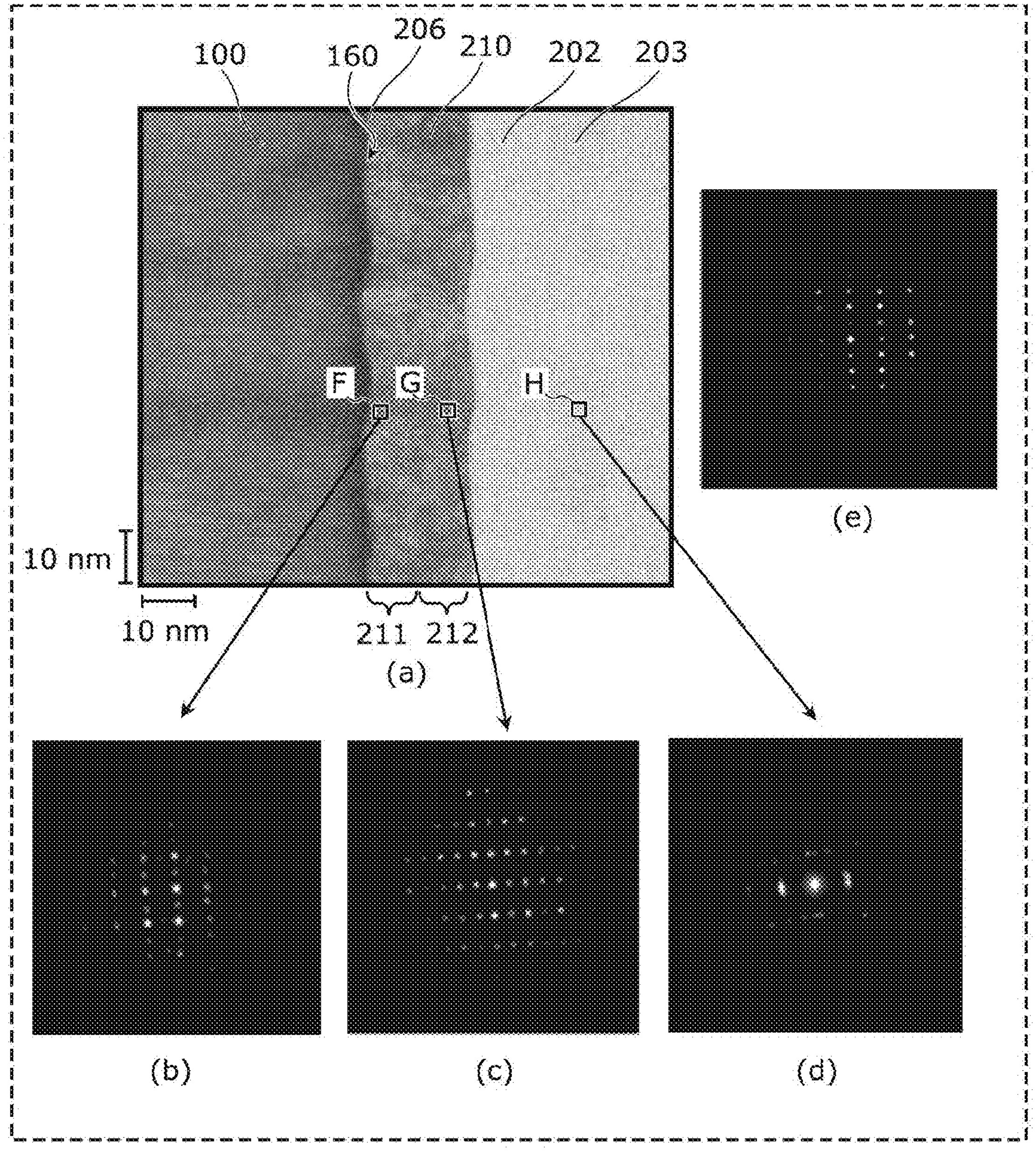
FIG. 21 is a diagram illustrating a TEM image of a nitride semiconductor light-emitting element according to Variation 3 of the embodiment.

FIG. 21 is a diagram illustrating a TEM image of a nitride semiconductor light-emitting element according to Variation 3 of the embodiment.

Specifically, part (a) of FIG. 21 is a diagram illustrating a TEM image of the nitride semiconductor light-emitting element according to Variation 3 of the embodiment. Part (b) of FIG. 21 is a diagram illustrating the electron diffraction pattern at position F. Part (c) of FIG. 21 is a diagram illustrating the electron diffraction pattern at position G. Part (d) of FIG. 21 is a diagram illustrating the electron diffraction pattern at position H. Part (e) of FIG. 21 is a diagram illustrating the electron diffraction pattern on a GaN substrate.

Dielectric film 206 disposed on the side closer to the resonator face 160 of nitride semiconductor 100 has a function of preventing decomposition and oxidation of an end face, and the main objective of dielectric film 206 is the prevention of an end face.

Meanwhile, the main objective of a dielectric film (e.g., dielectric films 201 through 204) formed on dielectric film 206 is control of a reflectance. For this reason, the crystal structure of a dielectric film provided for controlling a reflectance is required to be a closely-packed film whose crystal orientation is appropriately controlled.

The above-described closely-packed crystalline film has a property of producing high film stress. When a multilayer film including dielectric films is used for achieving an objective of controlling a reflectance, the film thickness of each of the dielectric films and the number of films included in the multilayer film are set according to a desired reflectance. Accordingly, film peeling is initiated due to a thermal shock and the like in closely-packed crystalline films that produce high stress.

From the above, a reduction in the density of a crystal included in a dielectric film along with an addition of Y alleviates the stress, thereby preventing an occurrence of film peeling. Specifically, the use of a polycrystalline film including an amorphous dielectric film reduces the film density, thereby alleviating the stress.

Clarity of the electron diffraction pattern and a large number of electron diffraction spots suggest that dielectric film 210 including YAlON is a closely-packed crystalline film whose crystal orientation is controlled.

Meanwhile, although obtainment of the electron diffraction pattern indicates that dielectric film 203 including YAlON includes a crystalline region, the diagram shows, as compared to dielectric film 201, a small number of electron diffraction spots and low spacing regularity of the electron diffraction spots. Since the electron diffraction pattern suggesting several orientations is obtained, dielectric film 203 can be considered to be a polycrystal including crystalline regions having different orientations.

Note that dielectric films 301 and 303 may have the same configuration as dielectric film 203. In other words, a crystal included in dielectric film 303 is different from a crystal included in dielectric film 301 in at least one of the crystal structure or the crystal orientation, for example.

In addition, a crystal included in dielectric film 303 may be different from a crystal included in dielectric film 301 in at least one of the crystal structure or the crystal orientation.

Moreover, optical interference film 310 may have a low reflectance by appropriately selecting a material and the film thickness. Dielectric multilayer film 200 may further include a multilayer coating film having a low reflectance as described above.

[Manufacturing Method]

[Nitride Semiconductor]

Nitride semiconductor 100 includes, on the principal surface (top surface) of base 102 including N-type GaN, N cladding layer 111, N guiding layer 112, N-side guiding layer 121, active layer 122, P-side guiding layer 123, intermediate layer 124, electron barrier layer 131, P cladding layer 132, and contact layer 133 that are sequentially and epitaxially grown using, for example, a metalorganic chemical vapor deposition (MOCVD) method.

For example, trimethylgallium (TMG), triethylgallium (TEG), or the like is used for the source of Ga of the group III element. Moreover, trimethylaluminum (TMA) or the like is used for the source of Al. In addition, trimethylindium (TMI) or the like is used for the source of In. Furthermore, ammonia ($NH_3$) or the like is used for the source of N of the group V element. Moreover, silane ($SiH_4$) or the like is used for the source of Si including an N-type dopant. In addition, bis(ethylcyclopentadienyl)magnesium (Cp2Mg) or the like is used for the source of Mg including a P-type dopant.

Next, a mask film (current block layer 141) that includes $SiO_2$ and covers a ridge-portion formed region is formed on contact layer 133 using a lithography method and an etching method.

Next, stripe-shaped ridge portions whose crystallographic-axis is in the <1-100> direction relative to the principal surface of base 102 are formed in the upper part of contact layer 133 and P cladding layer 132 by performing, using the formed mask film, dry etching with chlorine ($Cl_2$) as the main ingredient.

For the sake of convenience, the minus sign given to an index of the crystallographic-axis denotes the reverse of one index following the sign. In addition, the width of a ridge portion in P cladding layer 132 is, for example, 30 μm.

Next, P-side electrode 142 including Pd and Pt is deposited on contact layer 133 using, for example, a method combining a vacuum evaporation method and a lift-off method. Pad electrode 143 is thereafter deposited using the same lift-off method used for the formation of P-side electrode 142.

Next, base 102 is thinned (grinding of the back surface) for readily cleaving base 102. Thereafter, N-side electrode 101 including Ti is formed on the back surface (lower surface) of base 102 using a vacuum evaporation method, a sputtering method, or a CVD method.

Next, the epitaxial layers (each of the layers that has been epitaxially grown as described above) and base 102 are cleaved such that the resonator length at the ridge portions is 800 μm or 1200 μm to form end-face mirrors (i.e., resonator faces 160 and 161) of nitride semiconductor 100 both of which has the plane orientation of a (1-100) plane.

With this, nitride semiconductor 100 is manufactured.

[Dielectric Multilayer Film]

Dielectric multilayer films 200 and 300 can be formed using, an RF sputtering method, a magnetron sputtering method, an electron cyclotron resonance (ECR) sputtering method, or the like. In this embodiment, dielectric multilayer films 200 and 300 are formed using the ECR sputtering method.

In the ECR sputtering method, resonator faces 160 and 161 of nitride semiconductor 100 are irradiated with sputter ions having small kinetic energy. Accordingly, the density of crystal defects produced on an exposed surface of a semiconductor due to ion irradiation can be reduced. For this reason, the ECR sputtering method is suitable for forming a film by deposition on a semiconductor.

Dielectric films (e.g., dielectric films 201 through 204 and 301 through 303, and second coating film 322) including AlON and $Al_2O_3$ to which Y or La is added can be formed by deposition using reactive sputtering. The reactive sputtering uses (i) a combination of an AlN target material containing Y or La and nitrogen ($N_2$) gas and oxygen ($O_2$) gas or (ii) a combination of nitrogen gas and a metallic target material that is a solid solution in which Y or La is mixed with Al.

Particularly, a solid solution target is used in this embodiment, since the sputtering speed increases by applying a voltage to the target. The composition of oxygen and nitrogen in oxynitride is controlled by a flow rate of oxygen gas and nitrogen gas introduced to a chamber.

In this embodiment, when a film including AlON is deposited using an Al metallic target material that is a solid solution in which 1 wt. % of Y is mixed and can readily increase the purity by metal refining, mixed gas of oxygen and nitrogen is used as reactive gas.

Note that Ar gas is introduced to the ECR chamber together with oxygen gas and nitrogen gas for controlling the speed of film formation by deposition.

In addition, for formation of a film including AlON by deposition, the flow rate of argon gas is set to 30 ml/min, the flow rate of nitrogen gas is set to 5.5 ml/min, and the flow rate of oxygen gas is set to 0.3 ml/min in this embodiment. However, the flow rate of each gas is a mere example, and therefore is not limited to the flow rate as described above.

Note that dielectric film 206 including a silicon nitride film (SiN) and a dielectric film (e.g., dielectric film 205 and first coating film 321) including silicon oxide film ($SiO_2$) are formed by deposition, also using the ECR sputtering method using a Si target in this embodiment.

[Advantageous Effects]

As has been described above, nitride semiconductor light-emitting element 10 includes: nitride semiconductor 100 that has two resonator faces 160 and 161 that are opposed to each other; and a dielectric multilayer film that includes a first dielectric film layered on at least one resonator face of two resonator faces 160 and 161, and a second dielectric film layered on the first dielectric film. For example, nitride semiconductor light-emitting element 10 includes at least one of dielectric multilayer film 200 layered on resonator face 160 and dielectric multilayer film 300 layered on resonator face 161. The first dielectric film (dielectric film 201 or 301) includes aluminum oxynitride. The second dielectric film (dielectric film 202 or 302) includes aluminum oxide. The first dielectric film is a crystalline film. At least one of chemical elements of yttrium or lanthanum is added to the first dielectric film. At least one of chemical elements of yttrium or lanthanum is added to the second dielectric film.

According to the above, an addition of Y or La having larger bond energy to bond to oxygen than the bond energy of Al to bond to oxygen can prevent a solid phase reaction (interface solid phase reaction) through dispersion of oxygen at an interface between AlON and $Al_2O_3$. For this reason, film peeling does not readily occur even though a multilayer film that includes several dielectric films like dielectric multilayer films 200 and 300 is used. Accordingly, it is possible to improve the reliability of nitride semiconductor light-emitting element 10. In addition, since nitride semiconductor light-emitting element 10 includes several dielectric films like dielectric multilayer films 200 and 300, the reflectance can be readily controlled. When a film including $Al_2O_3$ that is amorphous is formed by deposition on an AlON film that is a crystal in conventional structures, a solid phase reaction through dispersion of oxygen occurs between AlON and $Al_2O_3$ due to a difference in stress between a crystalline film and an amorphous film and light absorption caused by a dangling bond formed on the interface. With this, film peeling readily occurs. From the above, at least one of Y or La (in this embodiment, Y) is added to dielectric films 201, 202, 301, and 302. For example, an addition of Y to both an AlON film and an $Al_2O_3$ film plays a role in joining both of the films together by Y being interposed between these two films. For this reason, film peeling does not readily occur. In addition, since Y terminates a dangling bond, it is possible to prevent a solid phase reaction due to light absorbed by a dangling bond, for example. Moreover, the use of an ECR sputtering device and a solid target of Al—Y (or Al—La) enables an YAlON film and a $YAl_2O_3$ film to be continuously formed by deposition inside the same deposition chamber. In other words, a YAlON film and an $YAl_2O_3$ film can be readily formed. La produces the same advantageous effects as Y.

In addition, for example, the dielectric multilayer film includes a first optical film including SiN or SiON which is disposed between at least one resonator face of resonator faces 160 and 161 and the first dielectric film. For example, as illustrated in FIG. 18, dielectric multilayer film 200C includes dielectric film 206 that is interposed between resonator face 160 and dielectric film 201.

For example, when crystallized YAlON is directly layered on resonator face 160, a large number of dangling bonds are generated at the interface between nitride semiconductor 100 and YAlON, and the generated dangling bonds may become light absorption sources. Furthermore, a difference in stress between nitride semiconductor 100 and YAlON may be a cause of film peeling. Like conventional configurations, a film including SiN and a film including AlON or $Al_2O_3$ not including Y present an adhesion problem since Si and Al form an eutectic compound and thus are separated.

Here, a dielectric multilayer film included in nitride semiconductor light-emitting element 10 includes a first dielectric film that includes Y (or La). Accordingly, Si and Y (or La) form an alloy called a silicide even if Si and Al form an eutectic compound. Specifically, Y (or La) included in dielectric film 201 is concentrated at crystal grains or the interface between dielectric film 201 and dielectric film 206. With this concentration, Si included in dielectric film 206 and Y (or La) included in dielectric film 201 form a silicide at the above-mentioned interface. For this reason, adhesion between dielectric film 206 and dielectric film 201 can be improved.

Note that when YAlON including oxygen is directly layered on resonator face 160 of nitride semiconductor 100 including GaN, oxygen may oxidize resonator face 160 when a film including YAlON is formed by deposition. For this reason, a first optical film (dielectric film 206) may include SiN.

In addition, for example, the first dielectric film (dielectric film 201 or 301) has an oxygen concentration of at least 2 atom % and at most 13.4 atom %.

For example, since Y has larger bond energy to bond to oxygen than the bond energy of Al to bond to oxygen, Y has great chemical ability to trap oxygen. Accordingly, Y produces an advantageous effect of preventing oxidation of resonator faces 160 and 161. However, oxidation of Y due to Y trapping oxygen readily cause a change in a refractive index of a dielectric film including YAlON. For this reason, a reflectance of a film including YAlN greatly changes due to Y trapping oxygen in the configuration disclosed by the above-mentioned PTL 4.

Here, as illustrated in FIG. 9, AlON that is a base material of dielectric films 201 and 301 includes a stable region in which a variation of a refractive index is small in the oxygen composition. Meanwhile, in, for example, AlN, a refractive index reduces by a minute amount of oxygen. In addition, when the oxygen composition of AlON is increased, AlON becomes amorphous due to a phase change. Accordingly, the refractive index is drastically reduced.

From the above, the first dielectric films (dielectric films 201 and 301) have the oxygen concentration that is at least 2 atom % and at most 13.4 atom % so as to make a change in the refractive index due to the first dielectric films absorbing (trapping) oxygen small. With the use of nitride semiconductor light-emitting element 10, nitride semiconductor light-emitting element 10 whose reflectance does not readily change can be implemented, or in other words, nitride semiconductor light-emitting element 10 whose reliability is further improved can therefore be implemented.

In addition, for example, dielectric multilayer film 200 includes dielectric film 203 layered on dielectric film 202, and dielectric film 204 layered on dielectric film 203. Dielectric film 203 includes aluminum oxynitride, and dielectric film 204 includes aluminum oxide. At least a portion of dielectric film 203 is crystalline. Moreover, at least one of chemical elements of yttrium or lanthanum is added to dielectric film 203. Furthermore, at least one of chemical elements of yttrium or lanthanum is added to dielectric film 204.

YAlON has a higher refractive index, compared to $YAl_2O_3$. According to the above, dielectric film 203 including YAlON having a higher refractive index and dielectric film 204 including $YAl_2O_3$ having a low refractive index are provided for dielectric film 201 and dielectric film 202. As described above, layering of several films having different refractive indexes and appropriate thicknesses can control dielectric multilayer film 200 to have a desired reflectance. Accordingly, as described above, a dielectric multilayer film including dielectric films 201 through 204 does not cause a variation in the dielectric films and film peeling due to the variation to readily occur, while readily controlling a reflectance to have a desired value.

In addition, for example, dielectric multilayer film 200 includes a second optical film (dielectric film 205) that includes silicon oxide and is layered on at least any of dielectric film 201, dielectric film 202, dielectric film 203, or dielectric film 204.

According to the above, Y (or La) is concentrated at crystal grains or an interface, and Si and Y (or La) form a silicide. Accordingly, adhesion between dielectric films can be improved.

In addition, for example, dielectric film 206 is disposed farthest (i.e., the outermost layer) from the at least one resonator face (e.g., resonator face 160) among a plurality of films (e.g., dielectric films 201 through 205) included in dielectric multilayer film 200.

In order to implement a low reflectance at resonator face 160, it is desirable to provide a dielectric material having a refractive index closer to the refractive index of air as the outermost layer of dielectric multilayer film 200. Here, silicon oxide such as $SiO_2$ is exemplified as an extremely versatile dielectric material and as a material having a low refractive index. However, since $SiO_2$ is a material having an extremely small thermal expansion coefficient, the risk of an occurrence of film peeling due to a difference in stress increases in a configuration of disposing $SiO_2$ on another dielectric film. Particularly, film peeling readily occurs in a state in which a light-emitting end face gets hot like a laser device. This may be a cause of a reduction in reliability. From the above, $SiO_2$ is provided as the outermost layer in the same manner as dielectric multilayer film 200. According to the above, (i) a reflectance can be reduced by dielectric film 206 reducing a difference in the refractive index between air and dielectric multilayer film 200, (ii) an occurrence of film peeling due to heat is prevented by dielectric film 206 keeping a distance as much as possible from resonator face 160, and (iii) dielectric film 205 can be layered with improved adhesion as a result of an effect of a silicide formed by Si and Y (or La). Therefore, nitride semiconductor light-emitting element 10 having a desired low reflectance and even higher reliability can be implemented.

In addition, for example, a crystal included in the third dielectric film (e.g., dielectric film 203 or 303) is different from a crystal included in the first dielectric film (e.g., dielectric film 201 or 301) in at least one of a crystal structure or a crystal orientation.

When an amorphous film and a crystalline film are layered in contact with each other, film peeling readily occurs due to a difference in stress between these films. From the above, the stress is alleviated (reduced) by reducing the crystallinity (i.e., an increase in an amorphous portion or barely disarranging a configuration having the most stable crystal structure) of the third dielectric film so that film peeling does not readily occur.

In addition, for example, dielectric multilayer film 300 includes at least two multilayer coating films that are sequentially and repeatedly formed by deposition, the at least two multilayer coating films 320 each being a set of first coating film 321 including silicon oxide and second coating film 322 layered on first coating film 321 and including aluminum oxynitride. At least one of chemical elements of yttrium or lanthanum is added to second coating film 322.

In order to increase an optical output from nitride semiconductor 100, it is necessary to increase the reflectance at resonator face 161. For example, in order to increase an optical output from nitride semiconductor 100, the reflectance at resonator face 161 may be at least 90%. A high reflectance at resonator face 161 as described above can be implemented by layering, on resonator face 161, an optical interference film (optical interference film 310) in which several sets of a film having a high refractive index called a ¼λ film and a film having a low refractive index are layered. An important point here is a difference in the refractive index between a film having a high refractive index and a film having a low refractive index. When the difference in the refractive index is small, an increase in the number of sets (the number of dielectric films) is necessary to obtain a high reflectance. Meanwhile, when the difference in the refractive index is large, the same effect can be achieved using a smaller number of sets as compared to when the difference in the refractive index is small. Consequently, a $SiO_2$ film is typically used as a film having a low refractive index. However, since $SiO_2$ is a material having an extremely small thermal expansion coefficient, the risk of occurrence of film peeling due to a difference in stress between $SiO_2$ and another dielectric film is created in a configuration of disposing $SiO_2$ on another dielectric film. Particularly, since a chip (e.g., nitride semiconductor 100) gets hot in a laser device, film peeling resulting from stress occurs. This may be a cause of a reduction in reliability. In order to ensure further improvement in adhesion and reliability, multilayer coating film 320 included in nitride semiconductor light-emitting element 10 includes a YAlON film including Y as a film (second coating film 322) having a high refractive index and $SiO_2$ as a film (first coating film 321) having a low refractive index. According to the above, Si and Y form a silicide at the interface between silicon oxide (e.g., $SiO_2$) and the YAlON film, and thus the adhesion is improved. In addition, $SiO_2$ has a refractive index lower than the refractive index of YAlON, for example. For this reason, optical interference film 310 including a plurality of multilayer coating films 320 each of which includes a $SiO_2$ film having a low refractive index and a YAlON film having a high refractive index can be set to a desired reflectance by appropriately setting the film thickness of each film. For example, in dielectric multilayer film 300, adhesion between dielectric films (coating films) is improved, and thus a high reflectance can be implemented.

Note that the above-described multilayer coating film may be used in dielectric multilayer film 200, for example. In this case, adhesion of dielectric films (coating films) is improved, and a low reflectance can be implemented by appropriately setting the film thickness of each film in the same manner as dielectric multilayer film 300.

In addition, for example, one of two resonator faces 160 and 161 (in this embodiment, resonator face 160) has a reflectance of at least 90%, and the other (in this embodiment, resonator face 161) of the two resonator faces has a reflectance of at most 1%.

According to the above, optical loss due to an effect of the reflectances of resonator faces 160 and 161 can be prevented.

In addition, for example, nitride semiconductor 100 has a hexagonal crystal structure. The at least one resonator face of resonator faces 160 and 161 is an m-plane among hexagonal crystal planes. The first dielectric film includes a crystal having a hexagonal crystal structure, and a c-axis of the crystal included in the first dielectric film is perpendicular to the at least one resonator face. In this embodiment, resonator 160 is an m-plane, and dielectric film 201 includes a crystal having a hexagonal crystal structure. In addition, the c-axis of a crystal included in dielectric film 201 is perpendicular to resonator face 160. In other words, the c-axis is parallel to a normal line of resonator face 160.

According to the above, nitride semiconductor 100 and dielectric film 201 are not in an epitaxial relationship since resonator face 160 is an-m plane and the c-axis of dielectric film 201 is perpendicular to resonator face 160. For this reason, stress resulting from a difference in lattice constants of crystals included in nitride semiconductor 100 and dielectric film 201 is not applied to resonator face 160. Accordingly, degradation of resonator face 160 can be prevented.

In addition, for example, nitride semiconductor 100 has a hexagonal crystal structure. The at least one resonator face of resonator faces 160 and 161 is an m-plane among hexagonal crystal planes. The first dielectric film is a crystalline film including a crystal having a hexagonal crystal structure. The first dielectric film includes: a first crystalline layer whose c-axis is parallel to the at least one resonator face; and a second crystalline layer whose c-axis is perpendicular to the at least one resonator face. the first crystalline layer is disposed closer to the at least one resonator face than the second crystalline layer is. In this embodiment, dielectric film 210 includes first crystalline layer 211 that is layered on resonator face 160 and whose c-axis parallel to resonator face 160, and second crystalline layer 212 that is layered on first crystalline layer 211 and whose c-axis is perpendicular to resonator face 160.

When a dielectric film not in an epitaxial relationship with resonator face 160 is directly layered on resonator face 160, a dangling bond is readily formed on resonator face 160. Such a dangling bond may become a light absorption source and may cause an increase in the temperature of resonator face 160. This may cause damage to resonator face 160. Here, provision of first crystalline layer 211 and second crystalline layer 212 like dielectric film 210 can move, inside dielectric film 210, an interface (i.e., a face not in an epitaxial relationship from the viewpoint of resonator face 160) corresponding to a break in a crystal face. According to the above, an effect produced by Y concentrating at the interface terminates a dangling bond. Moreover, making first crystalline layer 211 thin can reduce the stress applied to resonator face 160 of nitride semiconductor 100 which results from a difference in lattice constants. Note that an increase in the addition amount of Y having a large atomic radius is even more effective at further reducing the difference between lattice constants.

Accordingly, making (i) first crystalline layer 211 on the side closer to resonator face 160 to have a crystal orientation the same as the crystal orientation of nitride semiconductor 100 (more specifically, resonator face 160) and (ii) second crystalline layer 212 to have a crystal orientation different from the crystal orientation of first crystalline layer 211 terminates a dangling bond on resonator face 160, while alleviating the stress inside dielectric film 210. Accordingly, nitride semiconductor light-emitting element 10 having even higher reliability can be implemented.

Note that an increase in the addition amount of Y having a large atomic radius is even more effective at further reducing the difference between lattice constants.

In addition, for example, a wavelength of light emitted from nitride semiconductor 100 is at most 430 nm.

Figure 22:
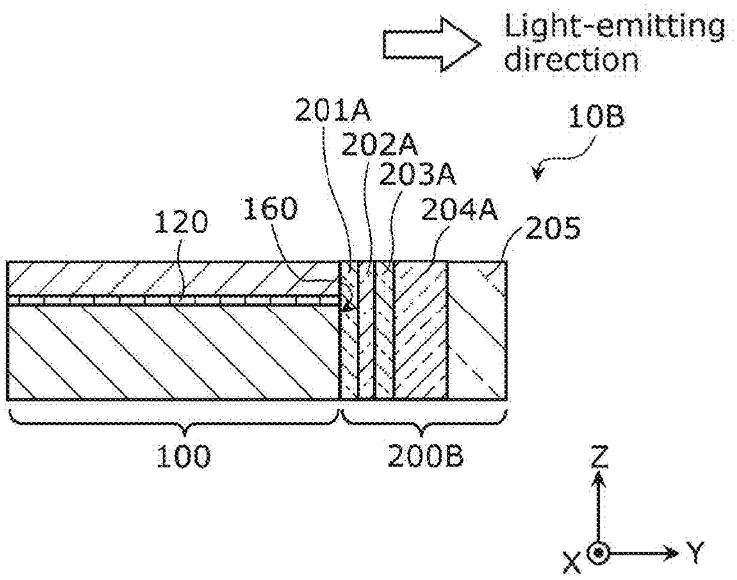
FIG. 22 is a cross sectional view schematically illustrating a configuration of a nitride semiconductor light-emitting element according to comparative example 2.
Figure 23:
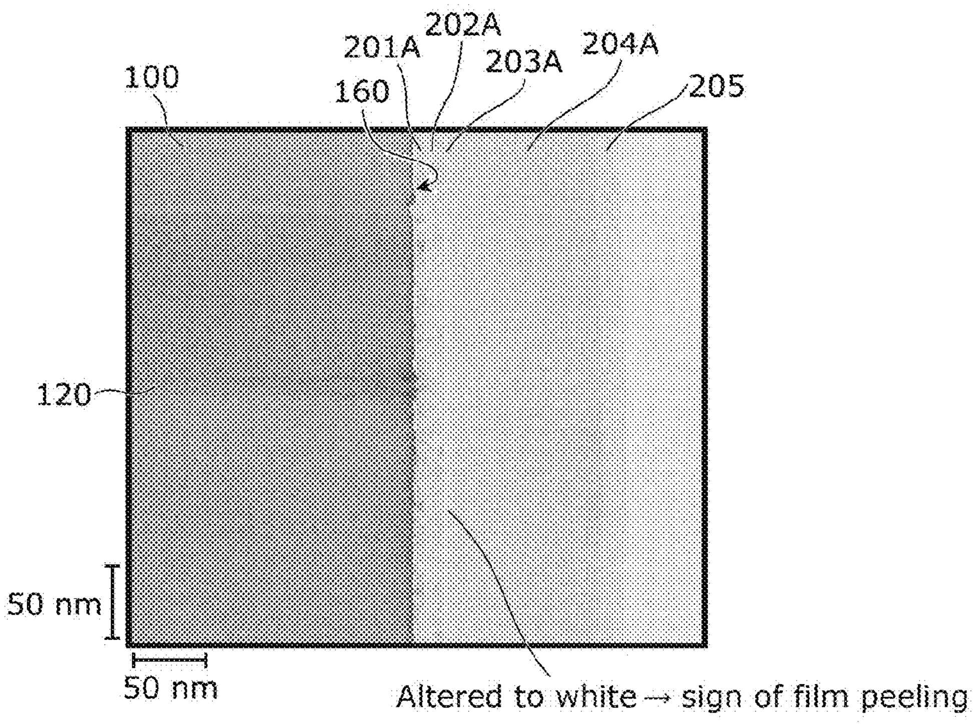
FIG. 23 is a diagram illustrating a TEM image of the nitride semiconductor light-emitting element according to comparative example 2.

FIG. 22 is a cross sectional view schematically illustrating a configuration of nitride semiconductor light-emitting element 10B according to comparative example 2. FIG. 23 is a diagram illustrating a TEM image of nitride semiconductor light-emitting element 10B according to comparative example 2. Note that FIG. 23 illustrates nitride semiconductor light-emitting element 10B that includes nitride semiconductor 100 having a stripe width of 30 μm and emits light whose wavelength is 450 nm in CW at Po of 5.0 W (at 25° C.) for 2000 hours.

As illustrated in FIG. 22, nitride semiconductor light-emitting element 10B includes nitride semiconductor 100 and dielectric multilayer film 200B including dielectric films 201A through 204A and 205.

As can be seen from FIG. 23, crystallization is not so progressed in dielectric film 202A.

Figure 24:
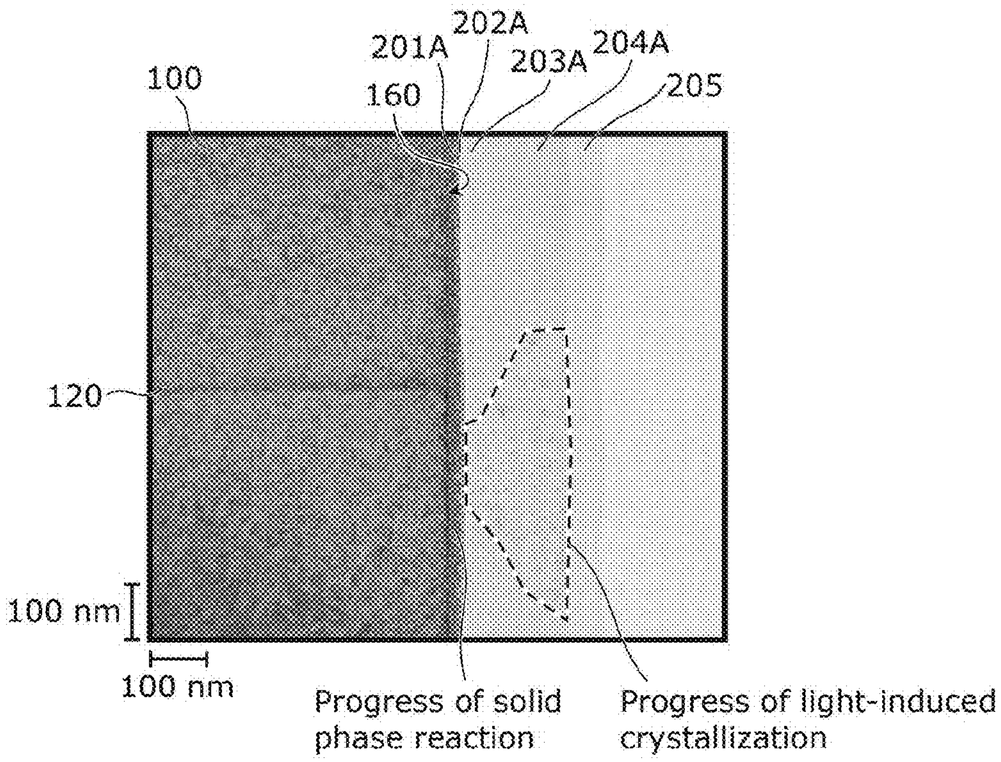
FIG. 24 is a diagram illustrating a TEM image of a nitride semiconductor light-emitting element according to comparative example 3.

FIG. 24 is a diagram illustrating another example of a TEM image of nitride semiconductor light-emitting element 10A according to comparative example 3. Note that FIG. 24 is a diagram illustrating a TEM image of nitride semiconductor light-emitting element 10A captured after emitting light under aging conditions different from the aging conditions under which the nitride semiconductor light-emitting element emitted light in FIG. 26. Specifically, FIG. 24 illustrates nitride semiconductor light-emitting element 10A that includes nitride semiconductor 100 having a stripe width of 30 μm and emits light whose wavelength is 405 nm in CW at Po of 5.0 W (at 25° C.) for 1000 hours.

As illustrated in FIG. 24, light-induced crystallization of dielectric film 204A is progressed, and deformation of dielectric film 204A due to the light-induced crystallization can be seen. In addition, progress of a solid phase reaction can be recognized in the vicinity of the interface between dielectric film 201A and dielectric film 202A.

From FIG. 23 and FIG. 24, it is suggested that the speed of light-induced crystallization caused by emission of light having a wavelength of 450 nm is lower than the speed of light-induced crystallization caused by emission of light having a wavelength of 405 nm. Meanwhile, a portion altered to white can be recognized in the vicinity of the interface between dielectric film 202A and dielectric film 203A. This can be considered as a sign of a solid phase reaction and film peeling.

It is known that alumina ($Al_2O_3$) that is amorphous and does not include Y crystallizes by receiving light (also called light-induced crystallization). It is also known that the speed (crystallization progress speed) of light-induced crystallization differs according to the wavelength of light. Particularly, the crystallization progress speed is low for light having a wavelength of blue light ranging from 445 nm to 455 nm which is used by a projector, a lighting device, and the like. Meanwhile, the crystallization progress speed is extremely fast for light having a wavelength in a range of from 370 nm to 405 nm which is shorter than a wavelength in the above-described wavelength range, when the light is compared as having the same optical density as the optical density of light having a wavelength of 445 nm, for example. Particularly, the crystallization progress speed sharply increases on the short wavelength side less than 430 nm.

An $Al_2O_3$ film is transparent in these wavelength ranges, but it is considered that the presence of a defect resulting from an oxygen defect in the film acts as a light absorption source, causing light absorption.

Furthermore, a dangling bond is present at the interface between dielectric films or at the interface between a resonator face and a dielectric film. Light absorption resulting from this dangling bond also increases with shortening of a wavelength.

When Y is added to the $Al_2O_3$ film here, Y terminates an oxygen defect and a dangling bond. In addition, Y having a large atomic radius produces an effect of obstructing atomic displacement within the amorphous film, and thus the crystallization is prevented.

From the above-described reasons, nitride semiconductor light-emitting element 10 including nitride semiconductor 100 that emits light whose center wavelength (e.g., the oscillation wavelength of laser light) is at most 430 nm can ensure high reliability, where occurrences of film peeling are particularly and effectively reduced and the reflectance is stably maintained.

In addition, for example, a sum of yttrium concentration and a lanthanum concentration in each of the first dielectric film and the second dielectric film is at most 0.4 atom %.

By adding at least one of Y or La as described above, at least one of Y or La can terminate a dangling bond, an oxygen defect, etc. at a grain boundary in both of the first dielectric film and the second dielectric film. For this reason, an extinction coefficient at each of a dielectric multilayer film and a resonator face is reduced (i.e., an optical absorption coefficient is also reduced), and thus heat generation at a resonator face due to light absorption is prevented. Accordingly, nitride semiconductor light-emitting element 10 that is even more reliable can be implemented.

Other Embodiments

Hereinbefore, the nitride semiconductor light-emitting element according to the present disclosure has been described based on the embodiments, but the present disclosure is not limited to these embodiments.

For example, although the structure of nitride semiconductor 100 is described in detail with reference to FIG. 3, etc. in the above embodiments, the structure is not limited to the structure described in the above embodiments as long as a nitride semiconductor has a structure that emits light. For example, nitride semiconductor 100 may include a P-type nitride semiconductor layer below light-emitting layer 120 and an N-type nitride semiconductor layer above light-emitting layer 120.

The present disclosure also encompasses: embodiments achieved by applying various modifications conceivable to those skilled in the art to each of the embodiments; and embodiments achieved by optionally combining the elements and the functions described in each of the embodiments without departing from the essence of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The nitride semiconductor light-emitting element according to the present disclosure can be used as a light source for: industrial lighting, facility lighting, a headlight for vehicles, an industrial laser device such as a laser machining device, and an image displaying device such as a laser display and a projector.

The invention claimed is:

1. A nitride semiconductor light-emitting element comprising:
- a nitride semiconductor that has two resonator faces opposed to each other; and
- a dielectric multilayer film that includes a first dielectric film layered on at least one resonator face of the two resonator faces, and a second dielectric film layered on the first dielectric film, wherein:
- the first dielectric film includes aluminum oxynitride,
- the second dielectric film includes aluminum oxide,
- the first dielectric film is a crystalline film,
- at least one of chemical elements of yttrium or lanthanum is added to the first dielectric film,
- at least one of chemical elements of yttrium or lanthanum is added to the second dielectric film,
- the dielectric multilayer film includes a third dielectric film layered on the second dielectric film, and a fourth dielectric film layered on the third dielectric film,
- the third dielectric film includes aluminum oxynitride,
- the fourth dielectric film includes aluminum oxide,
- at least a portion of the third dielectric film is crystalline,
- at least one of chemical elements of yttrium or lanthanum is added to the third dielectric film,
- at least one of chemical elements of yttrium or lanthanum is added to the fourth dielectric film,
- a crystal structure of a crystal included in the third dielectric film differs from a crystal structure of a crystal included in the first dielectric film, and
- a sum of yttrium concentration and a lanthanum concentration in each of the first dielectric film and the second dielectric film is more than zero and at most 0.4 atom %.

2. The nitride semiconductor light-emitting element according to claim 1, wherein
- the first dielectric film is a film whose entirety is crystalline.

3. The nitride semiconductor light-emitting element according to claim 2, wherein
- the second dielectric film is amorphous.

4. The nitride semiconductor light-emitting element according to claim 2, wherein
- the dielectric multilayer film includes a first optical film including SiN or SiON which is disposed between the at least one resonator face and the first dielectric film.

5. The nitride semiconductor light-emitting element according to claim 2, wherein
- the first dielectric film has an oxygen concentration of at least 2 atom % and at most 13.4 atom %.

6. The nitride semiconductor light-emitting element according to claim 2, wherein
- the dielectric multilayer film includes a second optical film that includes silicon oxide and is layered on at least any of the first dielectric film, the second dielectric film, the third dielectric film, or the fourth dielectric film.

7. The nitride semiconductor light-emitting element according to claim 6, wherein
- the second optical film is disposed farthest from the at least one resonator face among a plurality of films included in the dielectric multilayer film.

8. The nitride semiconductor light-emitting element according to claim 2, wherein
- the third dielectric film includes a crystal and a non-crystalline solid.

9. The nitride semiconductor light-emitting element according to claim 1, wherein
- the dielectric multilayer film includes a fifth dielectric film layered on the fourth dielectric film, and
- the fifth dielectric film includes amorphous silicon oxide.

10. A nitride semiconductor light-emitting element comprising:
- a nitride semiconductor that has two resonator faces opposed to each other; and
- a dielectric multilayer film that includes a first dielectric film layered on at least one resonator face of the two resonator faces, and a second dielectric film layered on the first dielectric film, wherein:
- the first dielectric film includes aluminum oxynitride,
- the second dielectric film includes aluminum oxide,
- the first dielectric film is a crystalline film,
- at least one of chemical elements of yttrium or lanthanum is added to the first dielectric film,
- at least one of chemical elements of yttrium or lanthanum is added to the second dielectric film,
- the dielectric multilayer film includes a third dielectric film layered on the second dielectric film, and a fourth dielectric film layered on the third dielectric film,
- the third dielectric film includes aluminum oxynitride,
- the fourth dielectric film includes aluminum oxide,
- at least a portion of the third dielectric film is crystalline,
- at least one of chemical elements of yttrium or lanthanum is added to the third dielectric film, at least one of chemical elements of yttrium or lanthanum is added to the fourth dielectric film, a crystal structure of a crystal included in the third dielectric film differs from a crystal structure of a crystal included in the first dielectric film, the dielectric multilayer film includes a second optical film that includes silicon oxide and is layered on at least any of the first dielectric film, the second dielectric film, the third dielectric film, or the fourth dielectric film, and a sum of yttrium concentration and lanthanum concentration in each of the first dielectric film and the second dielectric film is more than zero at most 0.4 atom %.

11. The nitride semiconductor light-emitting element according to claim 10, wherein the second optical film is disposed farthest from the at least one resonator face among a plurality of films included in the dielectric multilayer film.

12. The nitride semiconductor light-emitting element according to claim 10, wherein the third dielectric film includes a crystal and a non-crystalline solid.

13. The nitride semiconductor light-emitting element according to claim 10, wherein the dielectric multilayer film includes at least two multilayer coating films that are sequentially and repeatedly formed by deposition, the at least two multilayer coating films each being a set of a first coating film including silicon oxide and a second coating film layered on the first coating film and including aluminum oxynitride, and at least one of chemical elements of yttrium or lanthanum is added to the second coating film.

14. The nitride semiconductor light-emitting element according to claim 10, wherein one of the two resonator faces has a reflectance of at least 90%, and an other of the two resonator faces has a reflectance of at most 1%.

15. The nitride semiconductor light-emitting element according to claim 10, wherein the nitride semiconductor has a hexagonal crystal structure, the at least one resonator face is an m-plane among hexagonal crystal planes, the first dielectric film includes a crystal having a hexagonal crystal structure, and a c-axis of the crystal included in the first dielectric film is perpendicular to the at least one resonator face.

16. The nitride semiconductor light-emitting element according to claim 10, wherein the nitride semiconductor has a hexagonal crystal structure, the at least one resonator face is an m-plane among hexagonal crystal planes, the first dielectric film is a crystalline film including a crystal having a hexagonal crystal structure, the first dielectric film includes:

a first crystalline layer whose c-axis is parallel to the at least one resonator face; and a second crystalline layer whose c-axis is perpendicular to the at least one resonator face, and the first crystalline layer is disposed closer to the at least one resonator face than the second crystalline layer is.

17. The nitride semiconductor light-emitting element according to claim 10, wherein a wavelength of light emitted from the nitride semiconductor is at most 430 nm.

18. The nitride semiconductor light-emitting element according to claim 10, wherein the sum of yttrium concentration and lanthanum concentration in each of the first dielectric film and the second dielectric film is at most 0.05 atom %.

19. A nitride semiconductor light-emitting element comprising:

a nitride semiconductor that has two resonator faces opposed to each other; and a dielectric multilayer film that includes a first dielectric film layered on at least one resonator face of the two resonator faces, and a second dielectric film layered on the first dielectric film, wherein:

the first dielectric film includes aluminum oxynitride, the second dielectric film includes aluminum oxide, the first dielectric film is a crystalline film, yttrium is added to the first dielectric film, yttrium is added to the second dielectric film, the dielectric multilayer film includes a third dielectric film layered on the second dielectric film, and a fourth dielectric film layered on the third dielectric film, the third dielectric film includes aluminum oxynitride, the fourth dielectric film includes aluminum oxide, at least a portion of the third dielectric film is crystalline, yttrium is added to the third dielectric film, yttrium is added to the fourth dielectric film, a crystal structure of a crystal included in the third dielectric film differs from a crystal structure of a crystal included in the first dielectric film, and yttrium concentration in each of the first dielectric film and the second dielectric film is more than zero and at most 0.4 atom %.

* * * * *